(12) United States Patent
Kamijo et al.

(10) Patent No.: US 8,144,090 B2
(45) Date of Patent: Mar. 27, 2012

(54) DRIVER CIRCUIT, ELECTRO-OPTICAL DEVICE, AND ELECTRONIC INSTRUMENT

(75) Inventors: Haruo Kamijo, Shiojiri (JP); Motoaki Nishimura, Fujimi-machi (JP); Takeshi Nomura, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 1201 days.

(21) Appl. No.: 11/902,626

(22) Filed: Sep. 24, 2007

(65) Prior Publication Data

US 2009/0009446 A1 Jan. 8, 2009

(30) Foreign Application Priority Data

Sep. 27, 2006 (JP) .................................. 2006-261961
Sep. 3, 2007 (JP) .................................. 2007-227348

(51) Int. Cl.
G09G 3/36 (2006.01)
(52) U.S. Cl. ....... 345/87; 345/204; 345/690; 315/169.1; 315/169.3
(58) Field of Classification Search ............ 345/76–100, 345/204, 690; 315/169.1, 169.3
See application file for complete search history.

(56) References Cited

U.S. PATENT DOCUMENTS

| | | | |
|---|---|---|---|
| 6,816,144 B2 | 11/2004 | Tsuchi | |
| 7,098,885 B2 * | 8/2006 | Kumada et al. | 345/96 |
| 2002/0109653 A1 | 8/2002 | Kudo et al. | |
| 2005/0017935 A1 * | 1/2005 | Hirama | 345/87 |
| 2006/0103618 A1 * | 5/2006 | Miura | 345/96 |
| 2006/0274013 A1 * | 12/2006 | Lin et al. | 345/98 |
| 2006/0290635 A1 * | 12/2006 | Fratti et al. | 345/98 |

FOREIGN PATENT DOCUMENTS

| | | |
|---|---|---|
| JP | A-2002-149125 | 5/2002 |
| JP | A-2002-244622 | 8/2002 |
| JP | A-2004-354758 | 12/2004 |
| JP | A-2005-070540 | 3/2005 |
| JP | A-2006-139071 | 6/2006 |
| KR | 2003-0087498 A | 11/2003 |

* cited by examiner

*Primary Examiner* — Quan-Zhen Wang
*Assistant Examiner* — Jennifer Nguyen
(74) *Attorney, Agent, or Firm* — Oliff & Berridge, PLC

(57) ABSTRACT

A driver circuit for driving source lines of an electro-optical device includes first and second source short-circuit circuits that respectively short-circuit first and second source lines and a source short-circuit node, a source charge storage short-circuit circuit that short-circuits a source charge storage node connected with one end of a source capacitor and the source short-circuit node, a voltage setting circuit that supplies a given voltage to the source charge storage node, and a node short-circuit circuit that short-circuits a common electrode voltage output node and the source short-circuit node, a voltage output to a common electrode of the electro-optical device provided opposite to a pixel electrode through an electro-optical element being applied to the common electrode voltage output node.

17 Claims, 18 Drawing Sheets

| | COMMON ELECTRODE | SOURCE LINE | |
| --- | --- | --- | --- |
| | | CHARGE RECYCLE | PRECHARGE |
| FIRST CONTROL METHOD | FIRST OPERATION MODE | FIRST OPERATION MODE | ON |
| SECOND CONTROL METHOD | SECOND OPERATION MODE | SECOND OPERATION MODE | ON |
| THIRD CONTROL METHOD | SECOND OPERATION MODE | OFF | ON |
| FOURTH CONTROL METHOD | OFF | SECOND OPERATION MODE | ON |

DRIVER CIRCUIT, ELECTRO-OPTICAL DEVICE, AND ELECTRONIC INSTRUMENT

Japanese Patent Application No. 2006-261961 filed on Sep. 27, 2006 and Japanese Patent Application No. 2007-227348 filed on Sep. 3, 2007, are hereby incorporated by reference in their entirety.

BACKGROUND OF THE INVENTION

The present invention relates to a driver circuit, an electro-optical device, an electronic instrument, and the like.

As a liquid crystal display (LCD) panel (display panel in a broad sense; electro-optical device in a broader sense) used for electronic instruments such as portable telephones, a simple matrix type LCD panel and an active matrix type LCD panel using a switching element such as a thin film transistor (hereinafter abbreviated as "TFT") have been known.

The simple matrix method can easily reduce power consumption as compared with the active matrix method. On the other hand, it is difficult to increase the number of colors or display a video image using the simple matrix method. The active matrix method is suitable for increasing the number of colors or displaying a video image, but has difficulty in reducing power consumption.

The simple matrix type LCD panel and the active matrix type LCD panel are driven so that the polarity of the voltage applied to a liquid crystal (electro-optical substance in a broad sense) forming a pixel is reversed alternately. As such an alternating drive method, line inversion drive and field inversion drive (frame inversion drive) have been known. In line inversion drive, the polarity of the voltage applied to the liquid crystal is reversed in units of one or more scan lines. In field inversion drive, the polarity of the voltage applied to the liquid crystal is reversed in field (frame) units.

In this case, the voltage level applied to a pixel electrode forming a pixel can be reduced by changing a common electrode voltage (common voltage) supplied to a common electrode provided opposite to the pixel electrode in synchronization with the inversion drive timing.

When using such alternating drive, power consumption increases accompanying charging or discharging the liquid crystal. In order to solve this problem, JP-A-2002-244622 discloses technology of reducing power consumption by initializing a charge stored in a liquid crystal to zero by short-circuiting two electrodes provided on either side of the liquid crystal during inversion drive, thereby causing the voltage to transition to the intermediate voltage before short-circuiting the electrodes, for example. JP-A-2004-354758 discloses technology of reducing power consumption by applying a precharge potential to the source line in a first precharge period before a pixel electrode write period and a second precharge period before changing the common electrode voltage, thereby reducing a change in potential of the source line when changing the common electrode voltage.

However, the technologies disclosed in JP-A-2002-244622 and JP-A-2004-354758 have a problem in that the effect of reducing power consumption varies depending on the voltage applied to the source line. Therefore, the effect of reducing the amount of charge by charging or discharging the common electrode, of which the polarity of the applied voltage is reversed, may be insufficient. According to the technology disclosed in JP-A-2002-244622, the amount of charging/discharging may be increased by short-circuiting the two electrodes provided on either side of the liquid crystal depending on the relationship between the voltage applied to the source line and the polarity of the common electrode voltage, whereby the effect of reducing power consumption may be reduced. Therefore, when recycling the supplied charge, it is preferable that the source line and the common electrode be driven while reliably reducing power consumption using a simple configuration.

On the other hand, priority may be given to a reduction in chip size and mounting area of a driver circuit and the like at the expense of the effect of reducing power consumption to some extent, depending on the application field of the driver circuit. This applies to the case of applying the driver circuit and the like to a product for which the customer (electronic instrument manufacturer) gives the highest priority to a reduction in cost of the driver circuit or an LCD panel including the driver circuit, for example.

Therefore, it is desirable to provide a driver circuit and the like which make it possible to give priority to a reduction in power consumption or a reduction in cost depending on the customer. Specifically, it is desirable that power consumption be minimized at the expense of a cost reduction effect to some extent (priority is given to reduction in power consumption) or cost be minimized at the expense of a power consumption reduction effect to some extent (priority is given to reduction in cost) using a simple configuration. It becomes possible to satisfy various users' demands using one type of driver circuit by providing such a driver circuit and the like, whereby the manufacturing cost can be further reduced.

According to the technology disclosed in JP-A-2-244622, since the potentials are adjusted by recycling a charge by means of a short circuit, a means which drives a load is not provided. Therefore, it takes time to recycle a charge. As a result, when the pixel electrode write time within one horizontal scan period is reduced, a charge recycle time may become insufficient. The pixel electrode write speed may be increased by the precharge technology disclosed in JP-A-2004-354758, for example. However, JP-A-2004-354758 does not disclose the configuration of a driver circuit and the like which make it possible to give priority to a reduction in power consumption or a reduction in cost depending on the customer.

SUMMARY

According one aspect of the invention, there is provided a driver circuit for driving a plurality of source lines of an electro-optical device, the driver circuit comprising:

a first source short-circuit circuit that short-circuits a first source line and a source short-circuit node;

a second source short-circuit circuit that short-circuits a second source line and the source short-circuit node, the first source line and the second source line being among the plurality of source lines;

a source charge storage short-circuit circuit that short-circuits a source charge storage node and the source short-circuit node, the source charge node being connected with one end of a source capacitor;

a voltage setting circuit that supplies a given voltage to the source charge storage node; and a node short-circuit circuit that short-circuits a common electrode voltage output node and the source short-circuit node, a voltage outputted to a common electrode of the electro-optical device provided opposite to a pixel electrode through an electro-optical element being applied to the common electrode voltage output node.

According to another aspect of the invention, there is provided an electro-optical device comprising:

a plurality of source lines;
a plurality of gate lines;

a plurality of pixels connected with one of the plurality of source lines and one of the plurality of gate lines;

a gate driver that scans the plurality of gate lines; and the driver circuit as defined in claim 1 that drives the plurality of source lines.

According to a further aspect of the invention, there is provided an electronic instrument comprising the above driver circuit.

According to a further aspect of the invention, there is provided an electronic instrument comprising the above electro-optical device.

DETAILED DESCRIPTION OF THE EMBODIMENT

Figure 1:
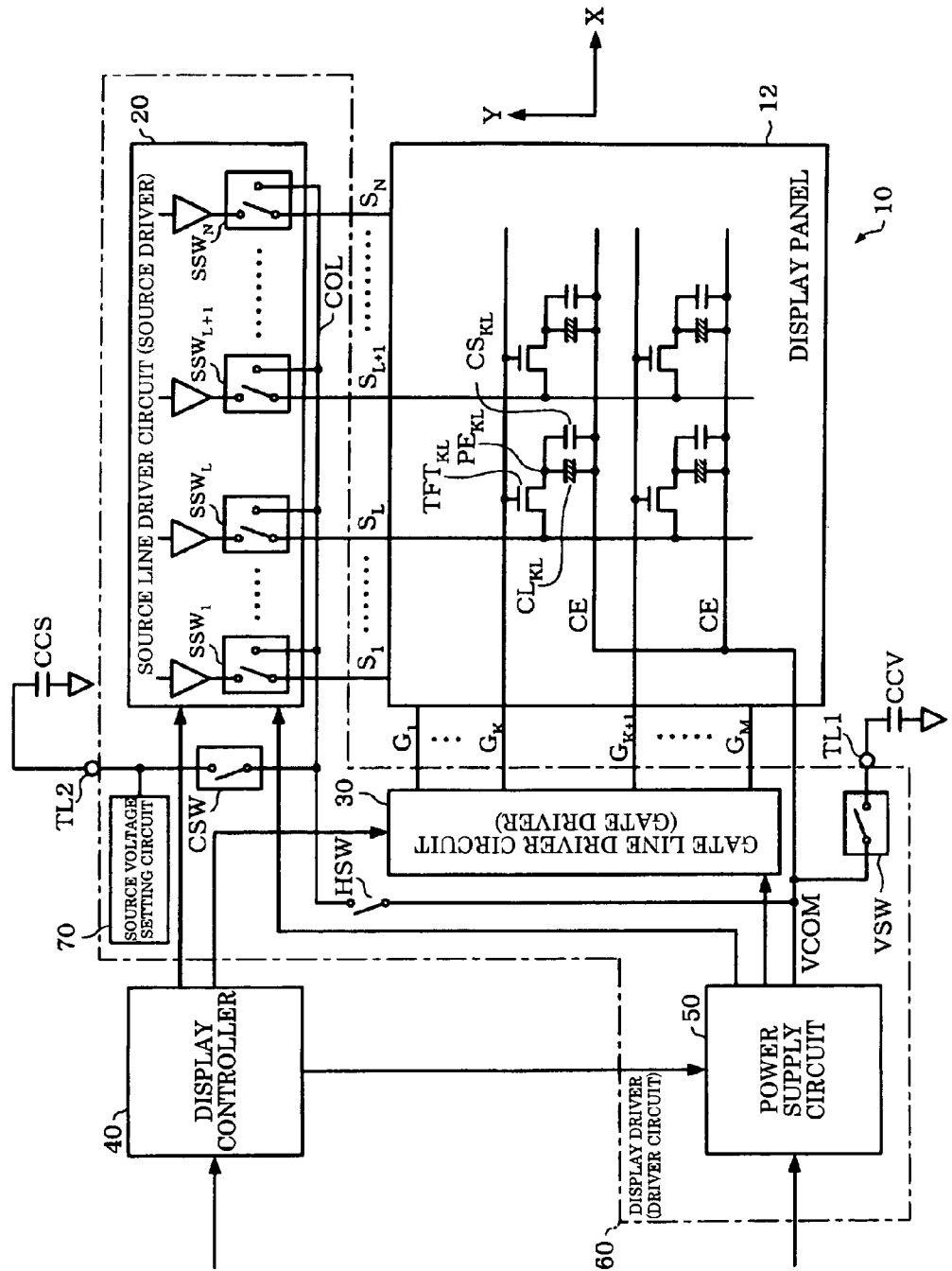
FIG. 1 is a block diagram showing a configuration example of a liquid crystal device according to one embodiment of the invention.

Aspects of the invention may provide a driver circuit enabling an increase in speed when recycling a charge and allowing priority to be given to a reduction in power consumption or a reduction in cost using a simple configuration, an electro-optical device, and an electronic instrument.

According to one embodiment of the invention, there is provided a driver circuit for driving a plurality of source lines of an electro-optical device, the driver circuit comprising:

a first source short-circuit circuit that short-circuits a first source line and a source short-circuit node;

a second source short-circuit circuit that short-circuits a second source line and the source short-circuit node, the first source line and the second source line being among the plurality of source lines;

a source charge storage short-circuit circuit that short-circuits a source charge storage node and the source short-circuit node, the source charge node being connected with one end of a source capacitor;

a voltage setting circuit that supplies a given voltage to the source charge storage node; and a node short-circuit circuit that short-circuits a common electrode voltage output node and the source short-circuit node, a voltage outputted to a common electrode of the electro-optical device provided opposite to a pixel electrode through an electro-optical element being applied to the common electrode voltage output node.

According to this embodiment, a charge can be recycled by short-circuiting the common electrode and the source short-circuit node by providing the node short-circuit circuit, or a charge can be recycled using the source capacitor. In either case, since the source lines can be precharged using the voltage setting circuit, a driver circuit can be provided which enables an increase in speed when recycling a charge and allowing priority to be given to a reduction in power consumption or a reduction in cost using a simple configuration.

In the driver circuit according to this embodiment, after setting the first source short-circuit circuit and second source short-circuit circuit in a conducting state, setting the node short-circuit circuit in a conducting state, and setting the source charge storage short-circuit circuit in a non-conducting state, the first source line and second source line may be precharged using the voltage setting circuit by setting the node short-circuit circuit in a non-conducting state, setting the first source short-circuit circuit and the second source short-circuit circuit in a conducting state, and setting the source charge storage short-circuit circuit in a conducting state, and then a grayscale voltage corresponding to grayscale data may be supplied to each of the plurality of source lines by setting the first source short-circuit circuit and the second source short-circuit circuit in a non-conducting state.

According to this embodiment, since a charge of the source lines can be recycled without providing a capacitor, the chip size and the mounting area of the driver circuit can be reduced.

In the driver circuit according to this embodiment, after setting the first source short-circuit circuit and the second source short-circuit circuit in a conducting state, setting the source charge storage short-circuit circuit in a conducting state, and setting the node short-circuit circuit in a non-conducting state while setting an output of the voltage setting circuit in a high impedance state, the first source line and the second source line may be precharged using the voltage setting circuit, and then a grayscale voltage corresponding to grayscale data may be supplied to each of the plurality of source lines by setting the first source short-circuit circuit and the second source short-circuit circuit in a non-conducting state.

According to this embodiment, a charge can be effectively recycled independent of the voltage applied to the source lines, whereby power consumption can be further reduced.

In the driver circuit according to this embodiment, the driver circuit may include the source capacitor.

In the driver circuit according to this embodiment, the voltage setting circuit may apply an OFF voltage of the electro-optical device to the source charge storage node when precharging the first source line and the second source line.

In the driver circuit according to this embodiment, when performing polarity inversion drive of the common electrode, the voltage setting circuit may apply a voltage that differs depending on the polarity of a voltage applied to the electro-optical element to the source charge storage node.

According to this embodiment, even if the intermediate value of the grayscale voltage supplied to the source line varies when performing polarity inversion drive, the amount of charging/discharging after the precharge period can be reduced irrespective of the positive period and the negative period, whereby power consumption can be further reduced.

In the driver circuit according to this embodiment, the driver circuit may include:

a common electrode charge storage short-circuit circuit that short-circuits a common electrode charge storage node and the common electrode voltage output node, the common electrode charge storage node being connected with one end of a common electrode capacitor;

the common electrode capacitor may be charged or discharged by repeatedly setting the common electrode charge storage short-circuit circuit in a conducting state and a non-conducting state while setting the node short-circuit circuit in a non-conducting state.

According to this embodiment, a charge can be recycled when driving the common electrode.

In the driver circuit according to this embodiment, the voltage setting circuit may include an operational amplifier to which a given precharge voltage is input, and an output voltage of the operational amplifier being supplied to one end of the source capacitor.

According to this embodiment, an effect of preventing oscillation of the operational amplifier can also be achieved.

In the driver circuit according to this embodiment, the operational amplifier may perform a class B amplification operation.

According to this embodiment, unnecessary current consumption can be reduced, whereby power consumption can be further reduced.

In the driver circuit according to this embodiment, the driver circuit may include:

a first source output operational amplifier and a second source output operational amplifier that respectively output a grayscale voltage corresponding to grayscale data to the first source line and the second source line, a high-potential-side power supply voltage of the first source output operational amplifier and the second source output operational amplifier may differ from a high-potential-side power supply voltage of the operational amplifier of the source voltage setting circuit.

According to this embodiment, since a low voltage can be employed as the power supply voltage of the source voltage setting circuit, the area of the source voltage setting circuit can be reduced. As a result, the cost of the driver circuit can be reduced.

In the driver circuit according to this embodiment, the driver circuit may include:

a first output operational amplifier and a second source output operational amplifier that respectively output a grayscale voltage corresponding to grayscale data to the first source line and the second source line, a high-potential-side power supply voltage of the first source output operational amplifier and the second source output operational amplifier may be a voltage obtained by boosting a high-potential-side power supply voltage of the operational amplifier of the source voltage setting circuit.

According to this embodiment, the power consumption of the operational amplifier of the voltage setting circuit can be reduced even when driving an identical load.

According to another embodiment of the invention, there is provided an electro-optical device comprising:

a plurality of source lines;
a plurality of gate lines;
a plurality of pixels connected with one of the plurality of source lines and one of the plurality of gate lines;
a gate driver that scans the plurality of gate lines; and
one of the above driver circuit that drives the plurality of source lines.

According to this embodiment, an electro-optical device can be provided which includes a driver circuit enabling an increase in speed when recycling a charge and allowing priority to be given to a reduction in power consumption or a reduction in cost using a simple configuration.

According to a further embodiment of the invention, there is provided an electronic instrument comprising one of the above driver circuit.

According to a further embodiment of the invention, there is provided an electronic instrument comprising the above electro-optical device.

According to this embodiment, an electronic instrument can be provided to which a driver circuit enabling an increase in speed when recycling a charge and allowing priority to be given to a reduction in power consumption or a reduction in cost using a simple configuration is applied.

The embodiments of the invention are described below in detail with reference to the drawings. Note that the embodiments described below do not in any way limit the scope of the invention laid out in the claims. Note that all elements of the embodiments described below should not necessarily be taken as essential requirements for the invention.

1. Liquid Crystal Device

FIG. 1 shows an example of a block diagram of a liquid crystal device according to this embodiment.

A liquid crystal device 10 (liquid crystal display device; display device in a broad sense) includes a display panel 12 (liquid crystal display (LCD) panel in a narrow sense), a source line driver circuit 20 (source driver in a narrow sense), a gate line driver circuit 30 (gate driver in a narrow sense), a display controller 40, a power supply circuit 50, and a source voltage setting circuit 70 (voltage setting circuit in a broad sense). The liquid crystal device 10 need not necessarily include all of these circuit blocks. The liquid crystal device 10 may have a configuration in which some of these circuit blocks are omitted. Although FIG. 1 illustrates an active matrix type liquid crystal device as an example, the following embodiment may also be applied to a simple matrix type liquid crystal device by a person skilled in the art.

The display panel 12 (electro-optical device in a broad sense) includes gate lines (scan lines), source lines (data lines), and pixel electrodes, each of the pixel electrodes being specified by one of the gate lines and one of the source lines. In this case, an active matrix type liquid crystal device may be formed by connecting a thin film transistor (TFT; switching element in a broad sense) with the source line and connecting the pixel electrode with the TFT.

Specifically, the display panel 12 is formed on an active matrix substrate (e.g. glass substrate). Gate lines $G_1$ to $G_M$ (M is a positive integer equal to or larger than two), arranged in a direction Y in FIG. 1 and extending in a direction X, and source lines $S_1$ to $S_N$ (N is a positive integer equal to or larger than two), arranged in the direction X and extending in the direction Y, are disposed on the active matrix substrate. A thin film transistor $TFT_{KL}$ (switching element in a broad sense) is provided at a position corresponding to the intersection of the gate line $G_K$ ($1 \leq K \leq M$, K is a positive integer) and the source line $S_L$ ($1 \leq L \leq N$, L is a positive integer).

A gate electrode of the thin film transistor $TFT_{KL}$ is connected with the gate line $G_K$, a source electrode of the thin film transistor $TFT_{KL}$ is connected with the source line $S_L$, and a drain electrode of the thin film transistor $TFT_{KL}$ is connected with a pixel electrode $PE_{KL}$. A liquid crystal capacitor $CL_{KL}$ (liquid crystal element) and a storage capacitor $CS_{KL}$ are formed between the pixel electrode $PE_{KL}$ and a common electrode CE opposite to the pixel electrode $PE_{KL}$ through a liquid crystal (electro-optical material in a broad sense). The liquid crystal is sealed between the active matrix substrate provided with the thin film transistor $TFT_{KL}$, the pixel electrode $PE_{KL}$, and the like and a common substrate provided with the common electrode CE. The transmissivity of the pixel changes depending on the voltage applied between the pixel electrode $PE_{KL}$ and the common electrode CE.

The voltage level of a common electrode voltage VCOM (high-potential-side voltage VCOMH and low-potential-side voltage VCOML) applied to the common electrode CE is generated by a common electrode voltage generation circuit included in the power supply circuit 50. The common electrode CE may be formed in a striped pattern corresponding to each gate line instead of forming the common electrode CE over the entire common substrate.

The source line driver circuit 20 drives the source lines $S_1$ to $S_N$ of the display panel 12 based on grayscale data. The gate line driver circuit 30 scans (sequentially drives) the gate lines $G_1$ to $G_M$ of the display panel 12.

The display controller 40 controls the source line driver circuit 20, the gate line driver circuit 30, and the power supply circuit 50 according to information set by a host (not shown) such as a central processing unit (CPU). Specifically, the display controller 40 sets the operation mode of the source line driver circuit 20 and the gate line driver circuit 30 or supplies a vertical synchronization signal or a horizontal synchronization signal generated therein to the source line driver circuit 20 and the gate line driver circuit 30, and controls the power supply circuit 50 regarding the polarity inversion timing of the voltage level of the common electrode voltage VCOM applied to the common electrode CE, for example.

The power supply circuit 50 generates various voltage levels (grayscale voltages) necessary for driving the display panel 12 and the voltage level of the common electrode voltage VCOM of the common electrode CE based on a reference voltage supplied from the outside.

The source voltage setting circuit 70 performs at least one of charge recycling and precharging of the source lines $S_1$ to $S_N$ before the source line driver circuit 20 drives the source lines $S_1$ to $S_N$. This reduces power consumption accompanying charging/discharging the source lines while achieving high-speed writing into the pixel electrodes.

In the liquid crystal device 10 having such a configuration, the source line driver circuit 20, the gate line driver circuit 30, the power supply circuit 50, and the source voltage setting circuit 70 cooperate to drive the display panel 12 based on grayscale data supplied from the outside under control of the display controller 40.

In FIG. 1, a display driver 60 (driver circuit in a broad sense) may be formed as a semiconductor device (integrated circuit (IC)) by integrating the source line driver circuit 20, the gate line driver circuit 30, the power supply circuit 50, and the source voltage setting circuit 70. The display driver 60 shown in FIG. 1 may have a configuration in which the gate line driver circuit 30 is omitted. In FIG. 1, it suffices that the display driver 60 according to this embodiment include the source line driver circuit 20, the common electrode voltage generation circuit of the power supply circuit 50, and the source voltage setting circuit 70.

The display driver 60 may include source output switch circuits $SSW_1$ to $SSW_N$, each of the source output switch circuits being provided between one of the source lines and an output buffer which drives the source line. The output of the output buffer is connected with a first terminal of the source output switch circuit. The source line is connected with a second terminal of the source output switch circuit. One end of a common line COL is connected with a third terminal of the source output switch circuit. The source output switch circuits $SSW_1$ to $SSW_N$ are simultaneously ON/OFF-controlled using a common control signal (not shown). The source output switch circuits $SSW_1$ to $SSW_N$ may be individually ON/OFF-controlled using a control signal supplied in units of source output switch circuits.

Each source output switch circuit may be configured to include a source short-circuit switch (source short-circuit switch circuit or source short-circuit circuit) by performing output enable control of setting the output of each output buffer in a high impedance state. Each source short-circuit switch circuit is inserted between the output of each output buffer and the common line COL.

The display driver 60 may include a first capacitor element connection terminal TL1 and a common electrode charge storage switch (common electrode charge storage switch circuit or common electrode charge storage short-circuit circuit) VSW. The common electrode charge storage switch VSW is provided between the output of the common electrode voltage generation circuit of the power supply circuit 50 (common electrode voltage output node to which the common electrode voltage VCOM is supplied) and the first capacitor element connection terminal TL1 (common electrode charge storage node C1ND). One end of a first capacitor element CCV (common electrode capacitor) is electrically connected with the first capacitor element connection terminal TL1. A specific power supply voltage (e.g., system ground power supply voltage VSS) is supplied to the other end of the first capacitor element CCV. In FIG. 1, the first capacitor element CCV is provided outside the display driver 60. Note that the first capacitor element CCV may be provided in the display driver 60.

The display driver 60 may include a source charge storage second capacitor element connection terminal TL2 and a source charge storage switch (source charge storage switch circuit or source charge storage short-circuit circuit) CSW. The source charge storage switch CSW is provided between one end of the common line COL and the second capacitor element connection terminal TL2. The output of the source voltage setting circuit 70 is connected with the common line COL through the source charge storage switch CSW.

In other words, the common line COL includes a second capacitor element connection node. One end of a second capacitor element CCS (source capacitor) is electrically connected with the second capacitor element connection terminal TL2. A specific power supply voltage (e.g. system ground power supply voltage VSS) is supplied to the other end of the second capacitor element CCS. In FIG. 1, the second capacitor element CCS is provided outside the display driver 60. Note that the second capacitor element CCS may be provided in the display driver 60.

When the common electrode charge storage switch (common electrode charge storage switch circuit or common electrode charge storage short-circuit circuit) VSW is set in a conducting state, the output of the common electrode voltage generation circuit of the power supply circuit 50 is set in a high impedance state.

The display driver 60 may include a node short circuit switch (node short-circuit switch circuit or node short-circuit circuit) HSW. The node short-circuit switch HSW is provided between the common line COL and the common electrode voltage output node.

The display driver 60 performs at least one of charge recycling from the common electrode CE or the source lines $S_1$ to $S_N$ and precharging before driving the source lines $S_1$ to $S_N$. The display driver 60 recycles a charge from the common electrode CE or the source lines $S_1$ to $S_N$ using the common electrode charge storage switch VSW, the source charge storage switch CSW, and the node short-circuit switch HSW depending on the operation mode.

In the operation mode in which a charge is recycled by ON/OFF-controlling the node short-circuit switch HSW, the display driver 60 performs control in a state in which the common electrode charge storage switch VSW is set in a non-conducting state. In the operation mode in which a charge is recycled by ON/OFF-controlling the common electrode charge storage switch VSW and the source charge storage switch CSW, the display driver 60 performs control in a state in which the node short-circuit switch HSW is set in a non-conducting state. When the display driver 60 performs precharging, the display driver 60 performs control in a state in which the source output switch circuits $SSW_1$ to $SSW_N$ are switched to the common line side (i.e., the source short-circuit switch is set in a conducting state), the source charge storage switch CSW is set in a conducting state, and the node short circuit switch HSW is set in a non-conducting state.

A detailed control example of each switch is described later.

In FIG. 1, the liquid crystal device 10 includes the display controller 40. Note that the display controller 40 may be provided outside the liquid crystal device 10. Alternatively, the host may be provided in the liquid crystal device 10 together with the display controller 40. Some or all of the source line driver circuit 20, the gate line driver circuit 30, the display controller 40, the power supply circuit 50, and the source voltage setting circuit 70 may be formed on the display panel 12.

Figure 2:
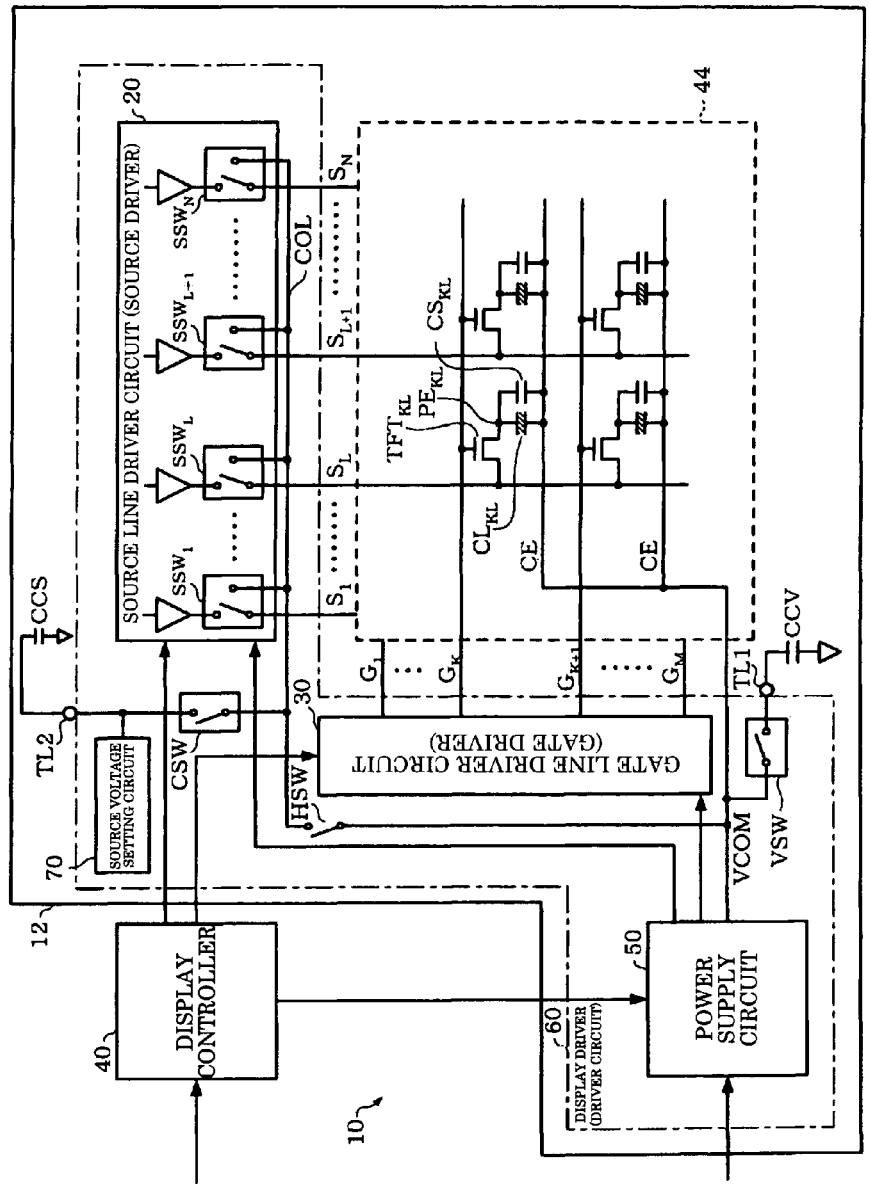
FIG. 2 is a block diagram showing another configuration example of a liquid crystal device according to one embodiment of the invention.

FIG. 2 is a block diagram showing another configuration example of the liquid crystal device according to this embodiment.

In FIG. 2, the display driver 60 including the source line driver circuit 20, the gate line driver circuit 30, and the power supply circuit 50 is formed on the display panel 12 (panel substrate). Specifically, the display panel 12 may be configured to include gate lines, source lines, pixels (pixel electrodes), each of the pixels being specified by one of the gate lines and one of the source lines, a source line driver circuit which drives the source lines, and a gate line driver circuit which scans the gate lines. The pixels are formed in a pixel formation region 44 of the display panel 12. Each pixel may include a TFT, of which the source is connected with the source line and the gate is connected with the gate line, and a pixel electrode connected with the drain of the TFT.

In FIG. 2, at least one of the gate line driver circuit 30 and the power supply circuit 50 may be omitted from the display panel 12.

2. Display Driver

The main configuration of the display driver 60 shown in FIG. 1 or 2 is described below.

Figure 3:
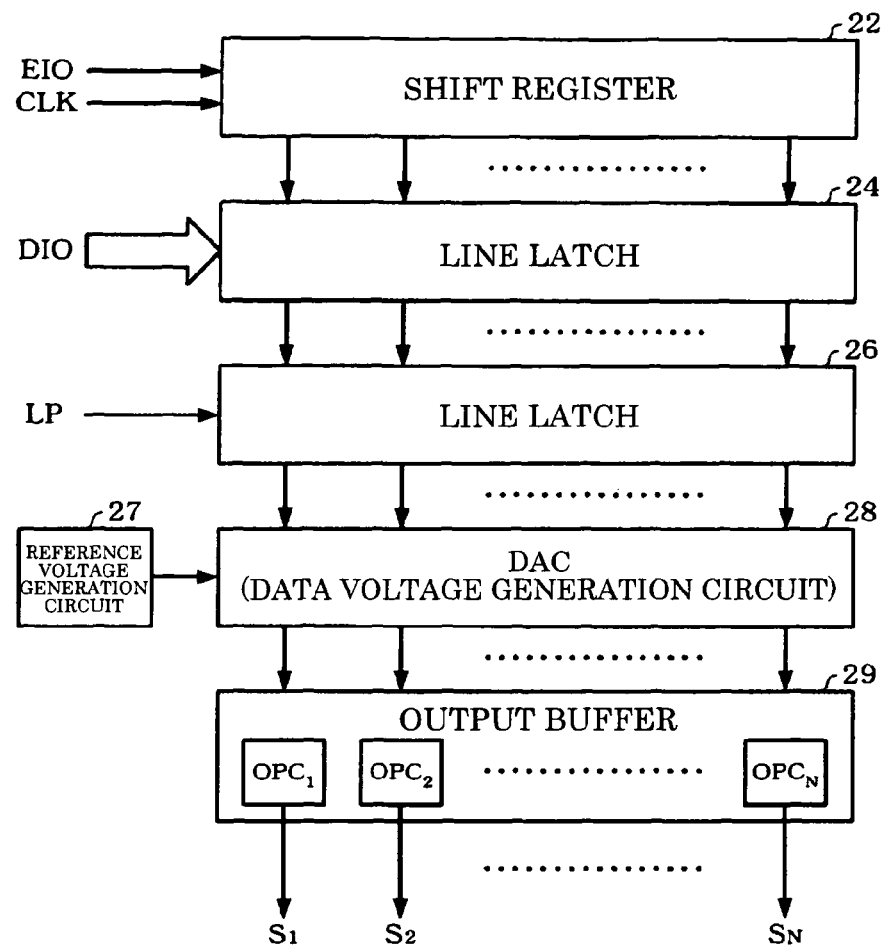
FIG. 3 is a block diagram showing a configuration example of a source line driver circuit shown in FIG. 1 or 2.
Figure 4:
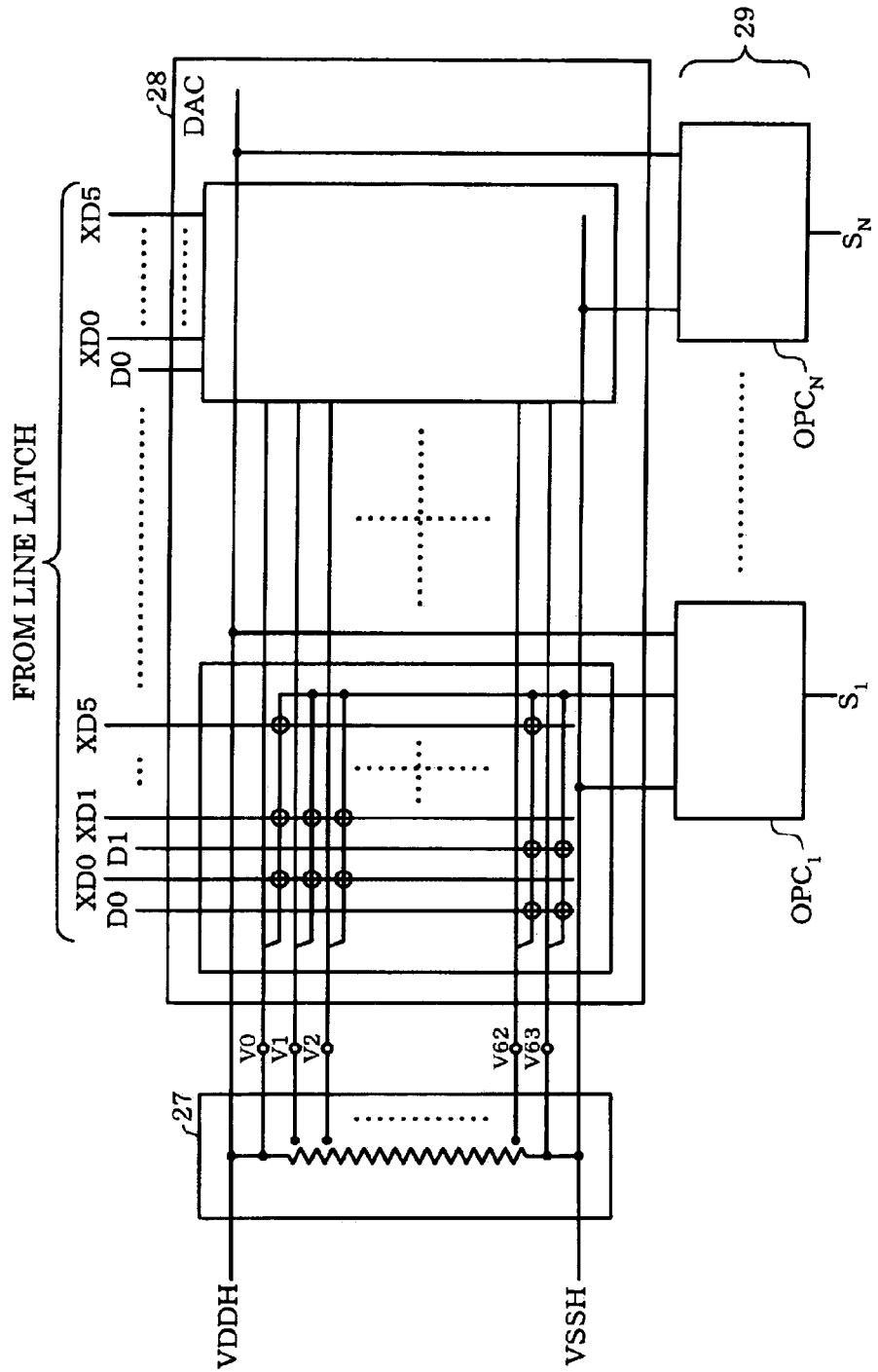
FIG. 4 is a block diagram showing a configuration example of a source line driver circuit shown in FIG. 1 or 2.

FIGS. 3 and 4 are block diagrams showing a configuration example of the source line driver circuit 20 shown in FIG. 1 or 2.

The source line driver circuit 20 includes a shift register 22, line latches 24 and 26, a reference voltage generation circuit 27, a digital-to-analog converter (DAC) 28 (data voltage generation circuit in a broad sense), and an output buffer 29.

The shift register 22 includes flip-flops provided corresponding to the source lines and sequentially connected. The shift register 22 holds an enable input-output signal EIO in synchronization with a clock signal CLK, and sequentially shifts the enable input-output signal EIO to the adjacent flip-flops in synchronization with the clock signal CLK.

Grayscale data (DIO) is input to the line latch 24 from the display controller 40 in units of 18 bits (6 bits (grayscale data)×3 (each color of RGB)), for example. The line latch 24 latches the grayscale data (DIO) in synchronization with the enable input-output signal EIO sequentially shifted by each flip-flop of the shift register 22.

The line latch 26 latches the grayscale data of one horizontal scan latched by the line latch 24 in synchronization with a horizontal synchronization signal LP supplied from the display controller 40.

The reference voltage generation circuit 27 generates 64 reference voltages. The 64 reference voltages generated by the reference voltage generation circuit 27 are supplied to the DAC 28.

The DAC (data voltage generation circuit) 28 generates an analog data voltage supplied to each source line. Specifically, the DAC 28 selects one of the reference voltages from the reference voltage generation circuit 27 based on the digital grayscale data from the line latch 26, and outputs an analog data voltage corresponding to the digital grayscale data.

The output buffer 29 buffers the data voltage from the DAC 28, and drives the source line by outputting the data voltage to the source line. Specifically, the output buffer 29 includes operational amplifier circuit blocks $OPC_1$ to $OPC_N$ provided in source line units and including a voltage-follower-connected operational amplifier. Each operational amplifier circuit block subjects the data voltage from the DAC 28 to impedance conversion, and outputs the resulting data voltage to the source line. The output buffer 29 includes the source output switch circuits (or source short-circuit switches) shown in FIG. 1 or 2. Each source output switch circuit is provided at the output of each operational amplifier circuit block.

FIG. 3 employs a configuration in which the digital grayscale data is subjected to digital-analog conversion and output to the source line through the output buffer 29. A configuration may also be employed in which an analog image signal is sampled/held and output to the source line through the output buffer 29.

The reference voltage generation circuit 27 generates the 64 reference voltages by dividing voltages VDDH and VSSH generated by the power supply circuit 50 using resistors. Each reference voltage corresponds to each grayscale value indicated by the 6-bit grayscale data. Each reference voltage is supplied in common to the source lines $S_1$ to $S_N$.

The DAC 28 includes decoders provided in source line units. The decoders respectively output the reference voltage corresponding to the grayscale data to the operational amplifier circuit blocks $OPC_1$ to $OPC_N$.

FIGS. 3 and 4 illustrate a configuration example when the grayscale data is supplied in line units. Note that the display driver 60 may include a display memory which stores the grayscale data of at least one frame (screen).

Figure 5:
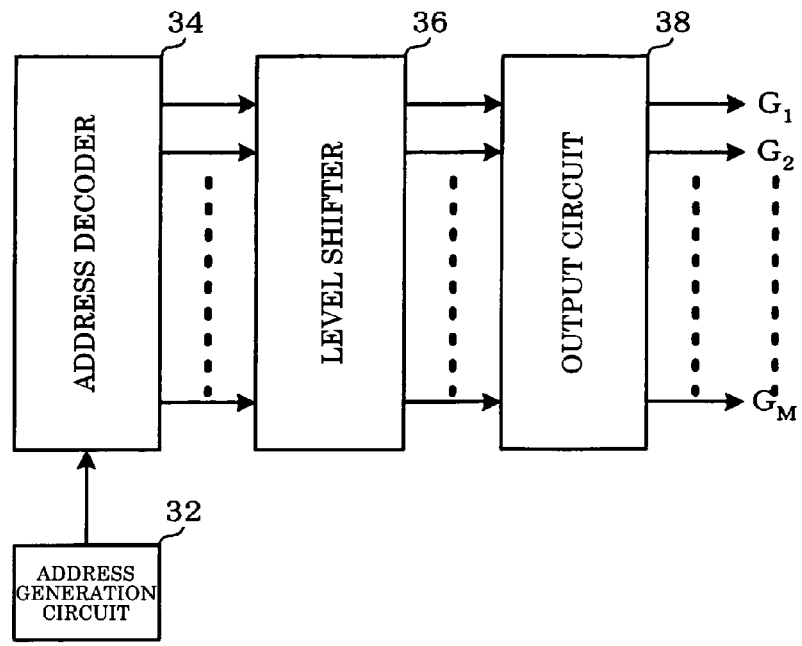
FIG. 5 is a view showing a configuration example of a gate line driver circuit shown in FIG. 1 or 2.

FIG. 5 shows a configuration example of the gate line driver circuit 30 shown in FIG. 1 or 2.

The gate line driver circuit 30 includes an address generation circuit 32, an address decoder 34, a level shifter 36, and an output circuit 38.

The address generation circuit 32 generates an address corresponding to one of the gate lines $G_1$ to $G_M$ to be selected. The address generation circuit 32 generates an address so that the gate lines $G_1$ to $G_M$ are selected and scanned one by one. The address generation circuit 32 generates an address so that one line is selected in synchronization with the horizontal synchronization signal when one vertical scan period has started in synchronization with the vertical synchronization signal from the display controller 40.

The address decoder 34 decodes the address generated by the address generation circuit 32, and selects decode signal lines corresponding to the gate lines $G_1$ to $G_M$ based on the decoding result.

The level shifter 36 shifts the voltage level of the signal of the decode signal line from the address decoder 34 to the voltage level corresponding to the liquid crystal element of the display panel 12 and the transistor capability of the TFT. Since a high voltage level is required as the above voltage level, a high voltage process differing from other logic circuit sections is used for the level shifter 34.

The output circuit 38 buffers a scan voltage shifted by the level shifter 36, and drives the gate line by outputting the scan voltage to the gate line.

Figure 6:
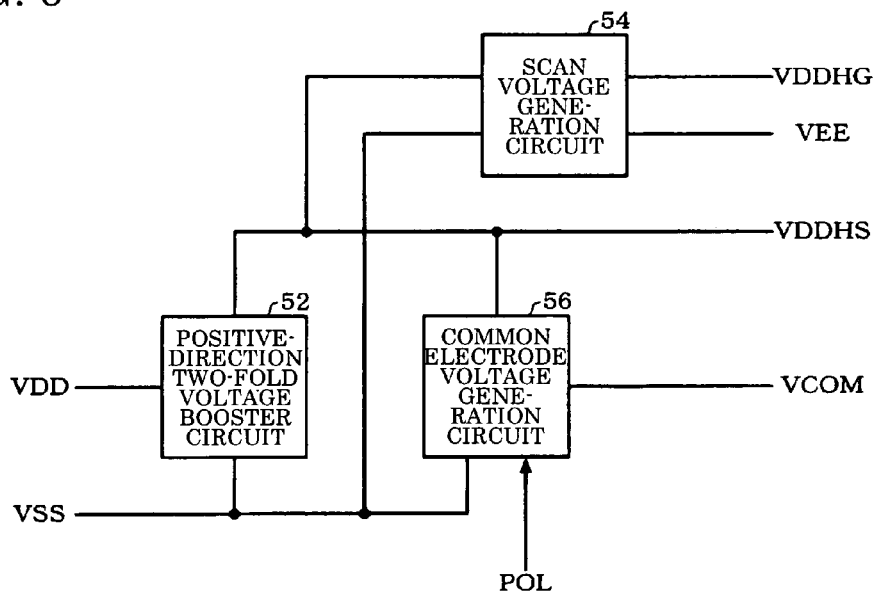
FIG. 6 is a view showing a configuration example of a power supply circuit shown in FIG. 1 or 2.

FIG. 6 shows a configuration example of the power supply circuit 50 shown in FIG. 1 or 2.

The power supply circuit 50 includes a positive-direction two-fold voltage booster circuit 52, a scan voltage generation circuit 54, and a common electrode voltage generation circuit 56. A system ground power supply voltage VSS and a system power supply voltage VDD are supplied to the power supply circuit 50.

The system ground power supply voltage VSS and the system power supply voltage VDD are supplied to the positive-direction two-fold voltage booster circuit 52. The positive-direction two-fold voltage booster circuit 52 generates a power supply voltage VDDHS by boosting the system power supply voltage VDD in the positive direction by a factor of two with respect to the system ground power supply voltage VSS. Specifically, the positive-direction two-fold voltage booster circuit 52 boosts the voltage difference between the system ground power supply voltage VSS and the system power supply voltage VDD by a factor of two. The positive-direction two-fold voltage booster circuit 52 may be formed using a known charge-pump circuit. The power supply voltage VDDHS is supplied to the source line driver circuit 20, the scan voltage generation circuit 54, and the common electrode voltage generation circuit 56. It is preferable that the positive-direction two-fold voltage booster circuit 52 output the power supply voltage VDDHS obtained by boosting the system power supply voltage VDD in the positive direction by a factor of two by boosting the system power supply voltage VDD by a factor equal to or larger than two and regulating the voltage level using a regulator.

The system ground power supply voltage VSS and the power supply voltage VDDHS are supplied to the scan voltage generation circuit 54. The scan voltage generation circuit 54 generates the scan voltage. The scan voltage is a voltage applied to the gate line selected by the gate line driver circuit 30. The high-potential-side voltage and the low-potential-side voltage of the scan voltage are voltages VDDHG and VEE, respectively.

The common electrode voltage generation circuit 56 generates the common electrode voltage VCOM. The common electrode voltage generation circuit 56 outputs the high-potential-side voltage VCOMH or the low-potential-side voltage VCOML as the common electrode voltage VCOM based on a polarity inversion signal POL. The polarity inversion signal POL is generated by the display controller 40 in synchronization with the polarity inversion timing.

Figure 7:
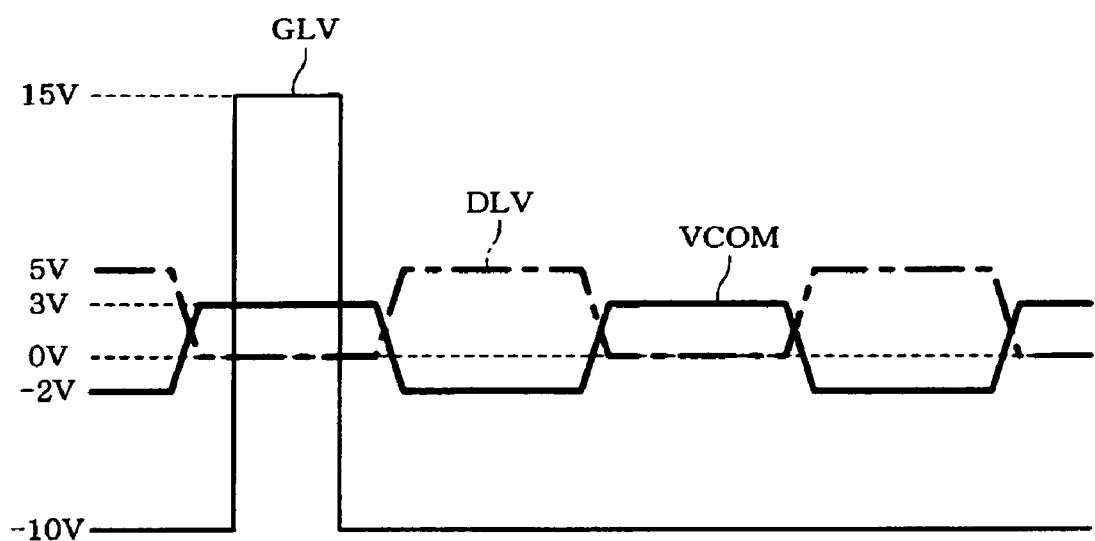
FIG. 7 is a view showing an example of a drive waveform of a display panel shown in FIG. 1 or 2.

FIG. 7 shows an example of the drive waveform of the display panel 12 shown in FIG. 1 or 2.

A grayscale voltage DLV corresponding to the grayscale value of the grayscale data is applied to the source line. In FIG. 7, the grayscale voltage DLV having an amplitude of 5 V with respect to the system ground power supply voltage VSS (=0 V) is applied to the source line.

A scan voltage GLV at the low-potential-side voltage VEE (=−10 V) is applied to the gate line in an unselected state, and a scan voltage GLV at the high-potential-side voltage VDDHG (=15 V) is applied to the gate line in a selected state.

The common electrode voltage VCOM at the high-potential-side voltage VCOMH (=3 V) or the low-potential-side voltage VCOML (=−2 V) is applied to the common electrode CE. The polarity of the voltage level of the common electrode voltage VCOM is reversed with respect to a given voltage in synchronization with the polarity inversion timing. FIG. 7 shows the waveform of the common electrode voltage VCOM during scan line inversion drive. The polarity of the grayscale voltage DLV applied to the source line is also reversed with respect to a given voltage in synchronization with the polarity inversion timing.

A liquid crystal element deteriorates when a direct-current voltage is applied for a long period of time. This makes it necessary to employ a drive method in which the polarity of the voltage applied to the liquid crystal element is reversed in units of specific periods. As such a drive method, frame inversion drive, scan (gate) line inversion drive, data (source) line inversion drive, dot inversion drive, and the like can be given.

Frame inversion drive reduces power consumption, but results in an insufficient image quality. Data line inversion drive and dot inversion drive provide an excellent image quality, but require a high voltage for driving a display panel.

This embodiment employs scan line inversion drive, for example. In scan line inversion drive, the polarity of the voltage applied to the liquid crystal element is reversed in units of scan periods (gate lines). For example, a positive voltage is applied to the liquid crystal element in the first scan period (gate line), a negative voltage is applied to the liquid crystal element in the second scan period, and a positive voltage is applied to the liquid crystal element in the third scan period. In the subsequent frame, a negative voltage is applied to the liquid crystal element in the first scan period, a positive voltage is applied to the liquid crystal element in the second scan period, and a negative voltage is applied to the liquid crystal element in the third scan period.

In scan line inversion drive, the polarity of the voltage level of the common electrode voltage VCOM applied to the common electrode CE is reversed in units of scan periods.

Figure 8:
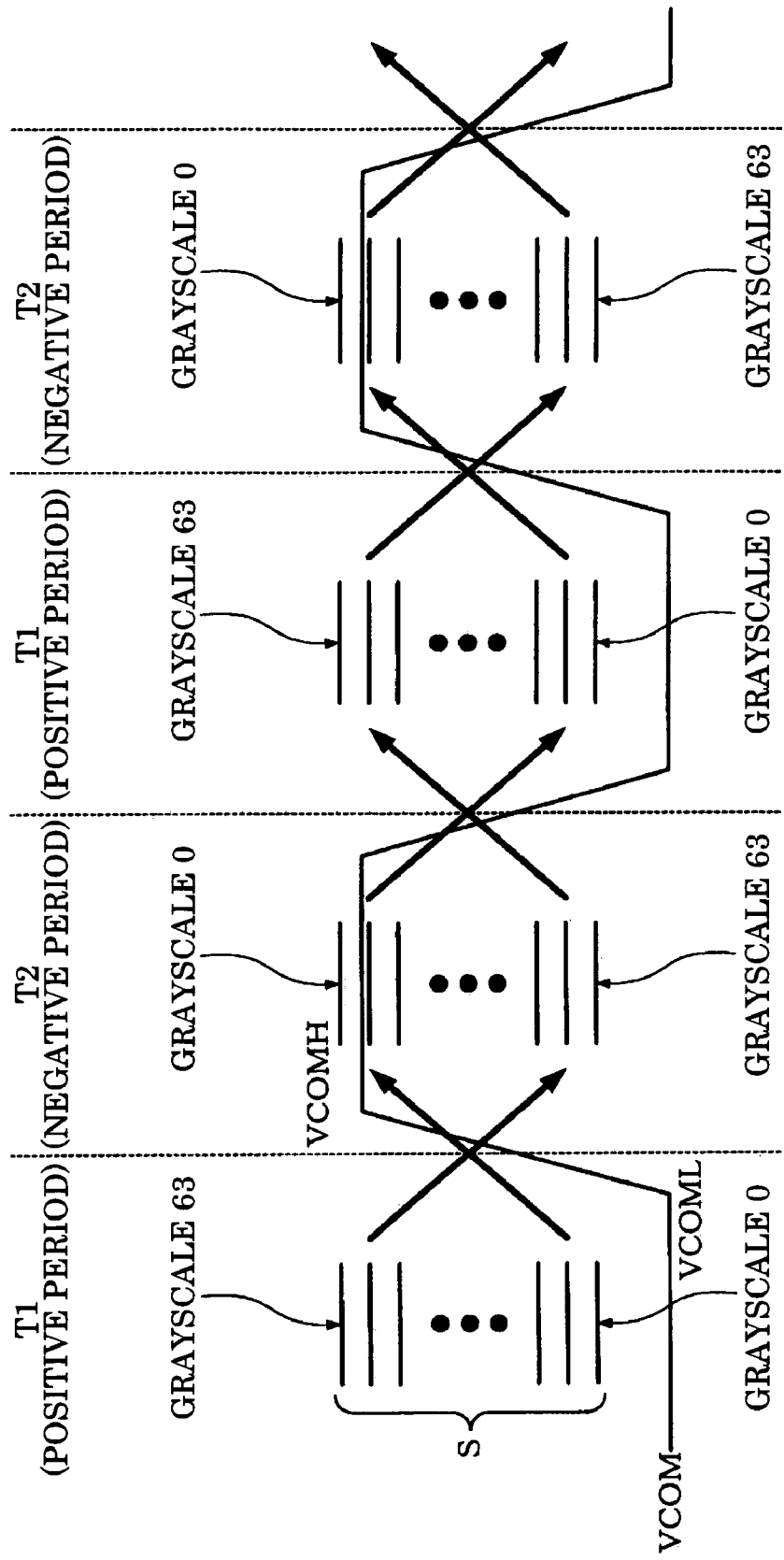
FIG. 8 is a view illustrative of polarity inversion drive.

Specifically, the voltage level of the common electrode voltage VCOM is set at the low-potential-side voltage VCOML in a positive period T1 (first period) and is set at the high-potential-side voltage VCOMH in a negative period T2 (second period), as shown in FIG. 8. The polarity of the grayscale voltage applied to the source line is also reversed at the above timing. The low-potential-side voltage VCOML has a voltage level obtained by reversing the polarity of the high-potential-side voltage VCOMH with respect to a given voltage level.

The positive period T1 is a period in which the voltage level of the pixel electrode to which the grayscale voltage is supplied through the source line is higher than the voltage level of the common electrode CE. In the period T1, a positive voltage is applied to the liquid crystal element. The negative period T2 is a period in which the voltage level of the pixel electrode to which the grayscale voltage is supplied through the source line is lower than the voltage level of the common electrode CE. In the period T2, a negative voltage is applied to the liquid crystal element.

The voltage necessary for driving the display panel can be reduced by thus reversing the polarity of the common electrode voltage VCOM. This makes it possible to reduce the withstand voltage of the driver circuit, thereby simplifying the driver circuit manufacturing process and reducing the manufacturing cost.

2.1 Control Example

Figure 9:
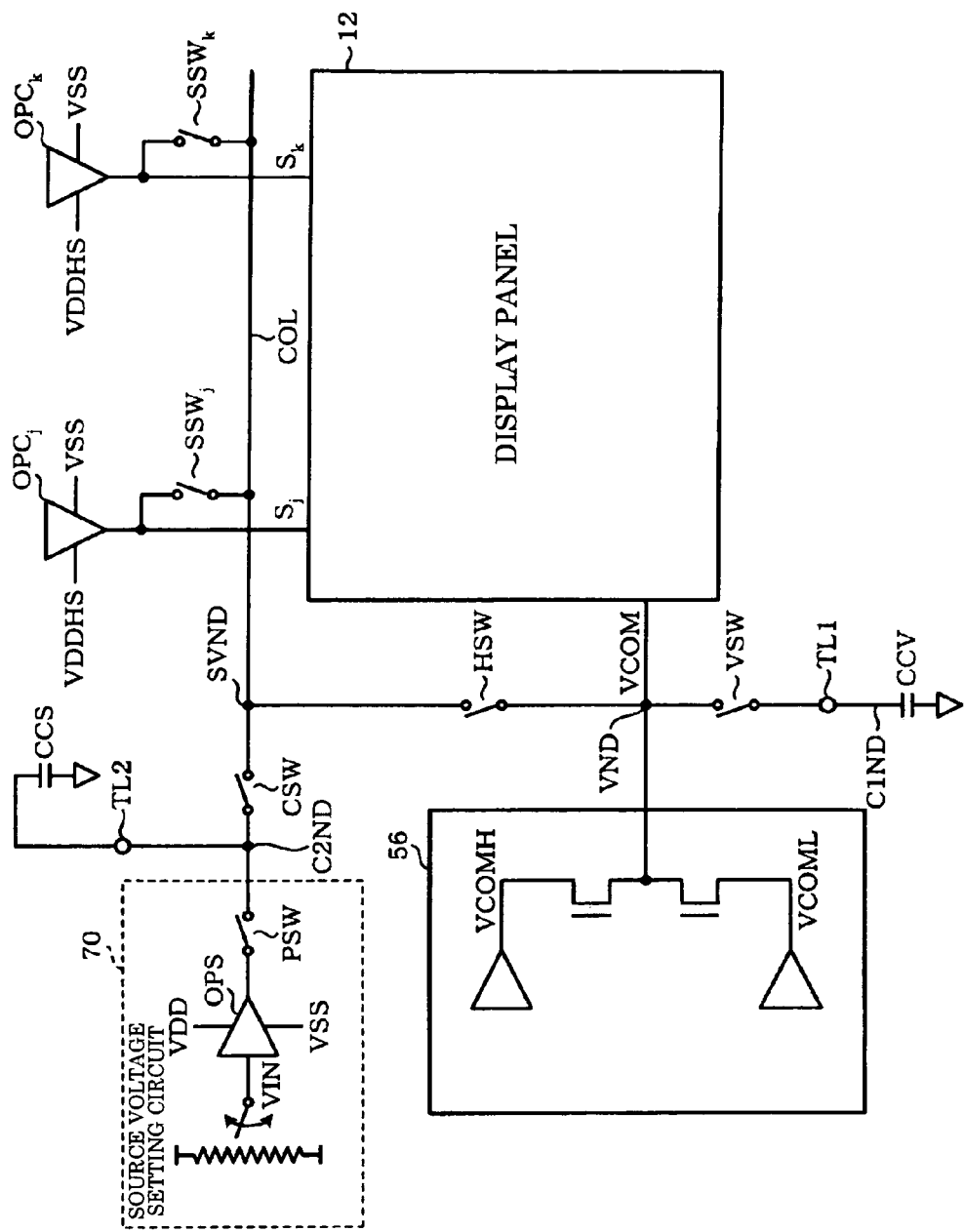
FIG. 9 shows the main portion of the configuration of a display driver according to one embodiment of the invention.

FIG. 9 shows the main portion of the configuration of the display driver 60 according to this embodiment.

In FIG. 9, the same sections as in FIG. 1 or 2 are indicated by the same symbols. Description of these sections is appropriately omitted. FIG. 9 shows only the source output switch circuits $SSW_j$ ($1 \leq j \leq N$; j is an integer) and $SSW_k$ ($1 \leq k \leq N$, $k \neq j$; k is an integer) among the source output switch circuits $SSW_1$ to $SSW_N$. Note that other source output switch circuits have the same configuration. In FIG. 9, each source output switch circuit includes the source short-circuit switch.

The source short-circuit switch of the source output switch circuit $SSW_j$ as a first source short-circuit circuit is provided between the source line $S_j$ (the output of the source output operational amplifier which drives the source line $S_j$) and a source short-circuit node SVND (common line COL). The source short-circuit switch of the source output switch circuit $SSW_k$ as a second source short-circuit circuit is provided between the source line $S_k$ (the output of the source output operational amplifier which drives the source line $S_k$) and the source short-circuit node SVND (common line COL).

The source charge storage switch CSW is provided between the source charge storage node C2ND connected with one end of the second capacitor element (source capacitor) CCS and the source short-circuit node SVND (common line COL).

The node short-circuit switch HSW is provided between a common electrode voltage output node VND, to which the voltage output to the common electrode CE of the display panel 12 (electro-optical device) provided opposite to the pixel electrode through the electro-optical element (liquid crystal element) is applied, and the source short-circuit node SVND.

The source voltage setting circuit 70 may include a voltage-follower-connected operational amplifier OPS, and a voltage setting switch (voltage setting switch circuit) PSW provided between the output of the operational amplifier OPS and the second capacitor element connection terminal TL2, for example. When performing output enable control of setting the output of the operational amplifier OPS in a high impedance state, a configuration in which the voltage setting switch PSW is omitted may be employed. Since the output voltage of the operational amplifier OPS is supplied to one end of the first capacitor element CCS, an effect of preventing oscillation of the operational amplifier OPS can be achieved.

A voltage (precharge voltage) which can be arbitrarily set between the highest voltage and the lowest voltage of the source voltage supplied to the source lines $S_1$ to $S_N$ is supplied to the input of the operational amplifier OPS. It is preferable that such a voltage be an OFF voltage of the display panel 12 as an electro-optical device. The term "OFF voltage" refers to a voltage at which the voltage between the pixel electrode and the common electrode through the liquid crystal element is lower than a given threshold value so that the transmissivity of the pixel becomes almost zero. The operational amplifier OPS subjects the voltage to impedance conversion, and supplies the output voltage to the source charge storage node C2ND.

The system power supply voltage VDD is supplied as a high-potential-side power supply voltage of the operational amplifier OPS, and the system ground power supply voltage VSS is supplied as a low-potential-side power supply voltage of the operational amplifier OPS.

The operational amplifier circuit block $OPC_j$ which drives the source line $S_j$ based on the grayscale voltage corresponding to the source line $S_j$ includes a source output operational amplifier (first source output operational amplifier). The high-potential-side power supply voltage VDDHS is supplied as a high-potential-side power supply voltage of the source output operational amplifier, and the system ground power supply voltage VSS is supplied as a low-potential-side power supply voltage of the source output operational amplifier. The operational amplifier circuit block $OPC_k$ which drives the source line $S_k$ based on the grayscale voltage corresponding to the source line $S_k$ includes a source output operational amplifier (second source output operational amplifier). The high-potential-side power supply voltage VDDHS is supplied as a high-potential-side power supply voltage of the source output operational amplifier, and the system ground power supply voltage VSS is supplied as a low-potential-side power supply voltage of the source output operational amplifier.

The high-potential-side power supply voltage VDDHS is a voltage obtained by boosting the high-potential-side power supply voltage VDD of the operational amplifier OPS of the source voltage setting circuit 70.

Note that the high-potential-side power supply voltage of the source output operational amplifier need not necessarily be a voltage obtained by boosting the high-potential-side power supply voltage of the source voltage setting circuit 70. The high-potential-side power supply voltage of the source output operational amplifier may be a voltage merely differing from the high-potential-side power supply voltage of the source voltage setting circuit 70. Specifically, the display driver 60 may include the first and second source output operational amplifiers respectively outputting the grayscale voltage corresponding to the grayscale data to the first and second source lines, and the high-potential-side power supply voltage of the first and second source output operational amplifiers may differ from the high-potential-side power supply voltage of the operational amplifier of the source voltage setting circuit 70. This enables a low voltage to be employed as the power supply voltage of the source voltage setting circuit 70, whereby the area of the source voltage setting circuit can be reduced. As a result, the cost of the display driver 60 can be reduced.

Figures 10, 11:
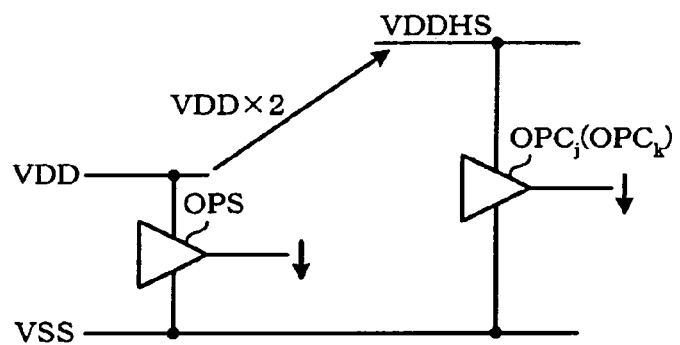
FIG. 10 shows the relationship between power supply voltages VDD and VDDHS.
FIG. 11 is a view illustrative of a control example of a display driver according to one embodiment of the invention.

FIG. 10 shows the relationship between the power supply voltages VDD and VDDHS.

The positive-direction two-fold voltage booster circuit 52 of the power supply circuit 50 generates the power supply voltage VDDHS by boosting the voltage between the system power supply voltage VDD and the system ground power supply voltage VSS in the positive direction by a factor of two with respect to the system ground power supply voltage VSS.

Power consumption P1 when the operational amplifier OPS charges or discharges a specific amount of charge Q through its output and power consumption P2 when the operational amplifier of the operational amplifier circuit block $OPC_j$ ($OPC_k$) charges or discharges the amount of charge Q through its output are discussed below. The current consumption when the operational amplifier of the operational amplifier circuit block $OPC_j$ ($OPC_k$) to which the power supply voltage VDDHS is supplied as the high-potential-side power supply voltage drives a specific current I is half the current consumption when the operational amplifier OPS to which the power supply voltage VDD is supplied as the high-potential-side power supply voltage drives the specific current I at its output. This is because the power supply voltage VDD is half the power supply voltage VDDHS. Specifically, the power consumption P1 is half the power consumption P2. In particular, since a charge charged or discharged through the power supply line to which the power supply voltage VDDHS is supplied is charged or discharged through the power supply line to which the power supply voltage VDD is supplied, power consumption can be reduced by taking the above-described measures.

In this embodiment, the display driver 60 or the display panel 12 includes an operation mode setting register (not shown), and controls charge recycling and precharging in the operation mode corresponding to control data set in the operation mode setting register. Alternatively, the display driver 60 or the display panel 12 includes an operation mode setting terminal (external setting terminal) (not shown), and controls charge recycling and precharging in the operation mode corresponding to the state of a signal supplied to the operation mode setting terminal from the outside.

FIG. 11 is a view illustrative of a control example of the display driver 60 according to this embodiment.

In this embodiment, charge recycling is performed when driving the common electrode or charge recycling or precharging is performed when driving the source lines by performing switch control of various switches shown in FIG. 9. The display driver 60 according to this embodiment performs control specified by one of the following first to fourth control methods based on the control data set in the operation mode setting register.

In the first control method, the display driver 60 performs charge recycling in a first operation mode before driving the common electrode. The display driver 60 performs charge recycling in the first operation mode, then precharges the source lines before driving the source lines, and then drives the source lines using the grayscale voltage corresponding to the grayscale data.

In the second control method, the display driver 60 performs charge recycling in a second operation mode before driving the common electrode. The display driver 60 performs charge recycling in the second operation mode, then precharges the source lines before driving the source lines, and then drives the source lines using the grayscale voltage corresponding to the grayscale data.

In the third control method, the display driver 60 performs charge recycling in the second operation mode before driving the common electrode. The display driver 60 precharges the source lines before driving the source lines without performing charge recycling, and then drives the source lines using the grayscale voltage corresponding to the grayscale data.

In the fourth control method, the display driver 60 does not perform charge recycling before driving the common electrode. The display driver 60 precharges the source lines before driving the source lines without performing charge recycling, and then drives the source lines using the grayscale voltage corresponding to the grayscale data.

2.1.1 First Control Method

Figure 12:
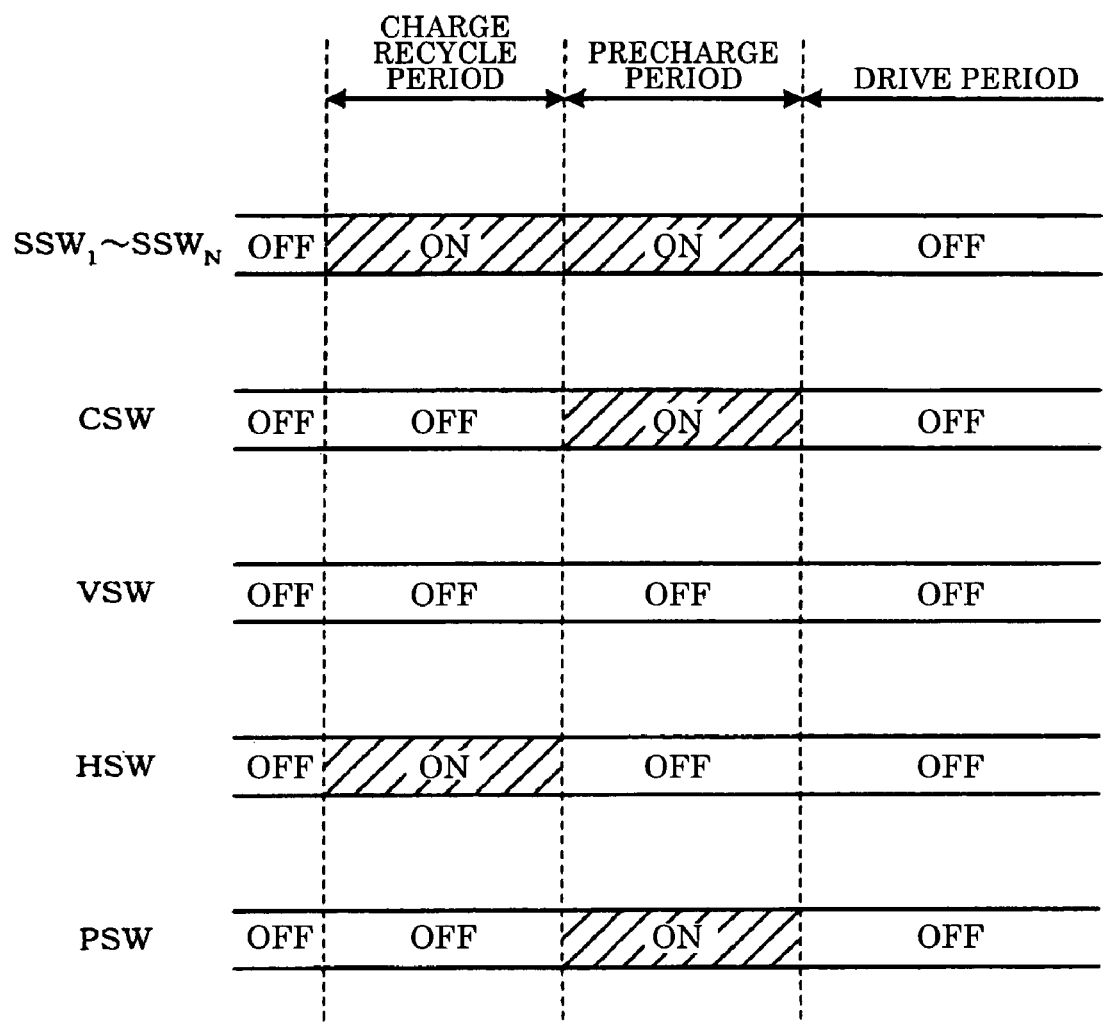
FIG. 12 is a view showing an example of a control timing of a first control method shown in FIG. 11.

FIG. 12 shows an example of the control timing of the first control method shown in FIG. 11.

FIG. 12 shows the case where each of the source output switch circuits $SSW_1$ to $SSW_N$ includes the source short-circuit switch, and illustrates the control state of the source short-circuit switch included in each source output switch circuit as the control state of each source output switch circuit. In FIG. 12, "ON" indicates that each switch is set in a conducting state, and "OFF" indicates that each switch is set in a non-conducting state.

In the first control method, a charge recycle period and a precharge period are provided before a drive period in which the source output operational amplifier drives the source line based on the grayscale voltage corresponding to the grayscale data.

In the charge recycle period, the source output switch circuits $SSW_1$ to $SSW_N$ are turned ON (i.e., the source short-circuit switch of each of the source output switch circuits $SSW_1$ to $SSW_N$ is turned ON), the source charge storage switch CSW is turned OFF, the common electrode charge storage switch VSW is turned OFF, the node short-circuit switch HSW is turned ON, and the voltage setting switch PSW is turned OFF. In FIG. 9, the source short-circuit switch circuits of the source output switch circuits $SSW_j$ and $SSW_k$ and the node short-circuit switch HSW are turned ON, the source charge storage switch CSW is turned OFF, the common electrode charge storage switch VSW is turned OFF, and the voltage setting switch PSW is turned OFF.

As a result, the source lines $S_1$ to $S_N$ and the common line COL are short-circuited and the common electrode voltage output node VND and the source short-circuit node SVND are short-circuited in the charge recycle period. Therefore, a charge moves so that the source lines $S_1$ to $S_N$ and the common electrode are set at the same potential, whereby a charge is recycled.

In the precharge period, the source output switch circuits $SSW_1$ to $SSW_N$ are turned ON (i.e., the source short-circuit switch of each of the source output switch circuits $SSW_1$ to $SSW_N$ is turned ON), the source charge storage switch CSW is turned ON, the common electrode charge storage switch VSW is turned OFF, the node short-circuit switch HSW is turned OFF, and the voltage setting switch PSW is turned ON. In FIG. 9, the source short-circuit switches of the source output switch circuits $SSW_j$ and $SSW_k$ are turned ON, the node short-circuit switch HSW is turned OFF, the source charge storage switch CSW is turned ON, and the common electrode charge storage switch VSW is turned OFF. The source voltage setting circuit 70 supplies a precharge voltage PV to the source charge storage node C2ND.

As a result, the precharge voltage is applied to the source lines $S_1$ to $S_N$ through the common line COL.

In the drive period after the precharge period, the source output switch circuits $SSW_1$ to $SSW_N$ are turned OFF (i.e., the source short-circuit switch of each of the source output switch circuits $SSW_1$ to $SSW_N$ is turned OFF), the source charge storage switch CSW is turned OFF, the common electrode charge storage switch VSW is turned OFF, the node short-circuit switch HSW is turned OFF, and the voltage setting switch PSW is turned OFF. The operational amplifier circuit blocks $OPC_1$ to $OPC_N$ supply the grayscale voltage corresponding to the grayscale data to the source lines $S_1$ to $S_N$.

Figure 13:
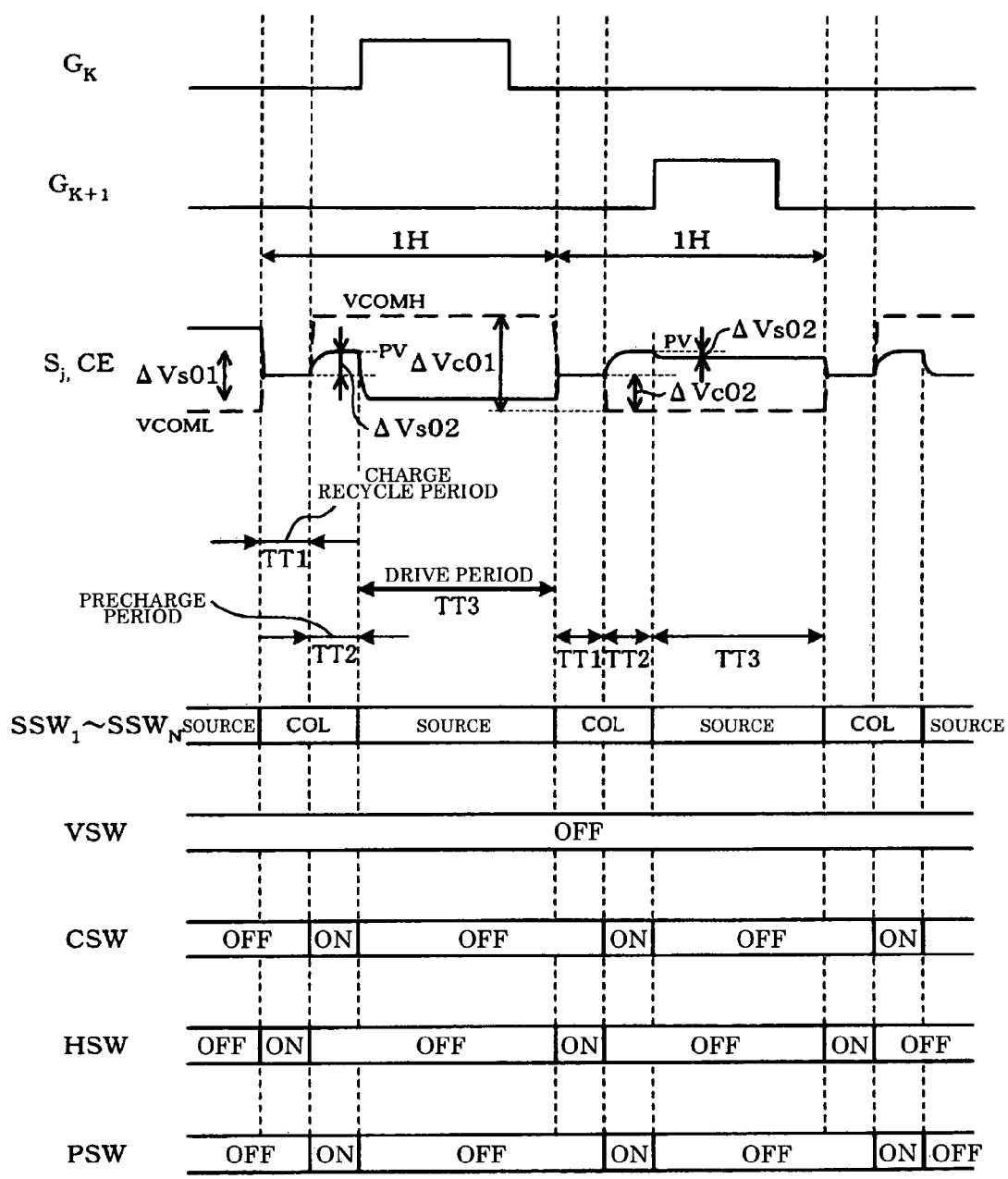
FIG. 13 is a waveform diagram showing an operation example of a liquid crystal device controlled using a first control method.

FIG. 13 is a waveform diagram showing an operation example of the liquid crystal device 10 controlled using the first control method.

FIG. 13 shows the changes in potentials of the gate lines $G_K$ and $G_{K+1}$, the source line $S_j$, and the common electrode CE. Note that the same waveforms apply to other gate lines and source lines. In FIG. 13, the scan voltage is applied to the gate line $G_K$ within one horizontal scan period (1H) which is the select period of the pixels connected with the gate line $G_K$, and the scan voltage is applied to the gate line $G_{K+1}$ within one horizontal scan period which is the select period of the pixels connected with the gate line $G_{K+1}$. Each horizontal scan period includes the charge recycle period, the precharge period, and the drive period.

In the charge recycle period (TT1), the source lines $S_j$ and $S_k$ are electrically connected with the common line COL including the second capacitor element connection node through the source output switch circuits $SSW_j$ and $SSW_k$, respectively. The node short-circuit switch HSW is set in a conducting state while the source charge storage switch CSW, the common electrode charge storage switch VSW, and the voltage setting switch PSW remain in a non-conducting state, whereby the common line COL is electrically connected with the output of the common electrode voltage generation circuit (common electrode voltage output node to which the common electrode voltage VCOM is supplied). Therefore, the common line COL is electrically connected with the source lines $S_j$ and $S_k$ in the charge recycle period so that the source lines $S_j$ and $S_k$ and the common electrode CE are set at the same potential, whereby a charge stored in parasitic capacitors of the source lines $S_j$ and $S_k$ is charged into the common electrode CE, or a charge stored in the common electrode CE is charged into parasitic capacitors of the source lines $S_j$ and $S_k$ according to the charge conservation law. Specifically, the potentials of the source lines and the common electrode CE are changed in the charge recycle period without supplying a charge from the power supply circuit 50.

In the precharge period (TT2) after the charge recycle period, the source lines $S_j$ and $S_k$ are electrically connected with the common line COL including the second capacitor element connection node through the source output switch circuits $SSW_j$ and $SSW_k$, respectively, in the same manner as in the charge recycle period. The source charge storage switch CSW and the voltage setting switch PSW are set in a conducting state, and the node short-circuit switch HSW is set in a non-conducting state. Therefore, the high-potential-side voltage VCOMH is supplied to the common electrode CE in the precharge period, for example. The precharge voltage PV is supplied to the common line COL. Since the common line COL is also electrically connected with the source lines $S_j$ and $S_k$ in the precharge period, the precharge voltage PV is supplied to the source lines $S_j$ and $S_k$.

In this case, the source voltage setting circuit 70 charges or discharges each source line until each source line is set at the potential of the precharge voltage PV with respect to the potential changed in the charge recycle period TT1. Accordingly, the source voltage setting circuit 70 generally need not change the voltage of the source line to a large extent in the precharge period after the charge recycle period. Specifically, when setting the potential of the source line in the present horizontal scan period (select period of the pixels connected with the gate line $G_K$) based on the potential of the source line in the preceding horizontal scan period (select period of the pixels connected with the gate line $G_{K-1}$), the source voltage setting circuit 70 must charge or discharge the source line by ΔVs01, as shown in FIG. 13. On the other hand, it suffices that the source voltage setting circuit 70 charge or discharge the source line by ΔVs02 (ΔVs02<ΔVs01) by providing the charge recycle period, as shown in FIG. 13. For example, although the amount of charging/discharging of the source line may be increased by precharging the source line to the precharge voltage PV, the amount of charging/discharging of the source line may be significantly reduced in the next horizontal scan period (1H), as shown in FIG. 13.

Moreover, even if charging/discharging cannot be sufficiently performed within the charge recycle period, the pixel electrode write time which should be completed within one horizontal scan period (1H) can be reduced by providing the precharge period.

In the drive period (TT3) after the precharge period, the source lines $S_L$ and $S_{L+1}$ are electrically connected with the outputs of the output buffers of the source line driver circuit 20 through the source output switch circuits $SSW_L$ and $SSW_{L+1}$, respectively. The source charge storage switch CSW, the common electrode charge storage switch VSW, and the voltage setting switch PSW are set in a non-conducting state. The node short-circuit switch HSW is set in a non-conducting state. Therefore, the source lines $S_j$ and $S_k$ are driven by the output buffers of the source line driver circuit 20 in the drive period.

In the drive period (TT3) after the precharge period, the common electrode CE is electrically connected with the output of the common electrode voltage generation circuit 56 of the power supply circuit 50. Therefore, the common electrode voltage VCOM from the common electrode voltage generation circuit 56 is supplied to the common electrode CE in the drive period. In this case, the common electrode voltage generation circuit 56 charges or discharges the common electrode CE until the high-potential-side voltage VCOMH is reached with respect to the potential changed in the charge recycle period TT1. Accordingly, the common electrode voltage generation circuit 56 need not change the voltage of the common electrode CE to a large extent in the drive period after the charge recycle period. Specifically, when setting the potential of the common electrode CE in the present horizontal scan period (select period of the pixels connected with the gate line $G_K$) based on the potential of the common electrode CE in the preceding horizontal scan period (select period of the pixels connected with the gate line $G_{K-1}$), the common electrode voltage generation circuit 56 must charge or discharge the common electrode CE by ΔVc01, as shown in FIG. 13. On the other hand, it suffices that the common electrode voltage generation circuit 56 charge or discharge the common electrode CE by ΔVc02 (ΔVc02<ΔVc01) by providing the charge recycle period, as shown in FIG. 13.

Specifically, a charge is recycled by repeatedly turning ON/OFF the common electrode charge storage switch VSW while the node short-circuit switch HSW is turned OFF to charge or discharge the first capacitor element CCV.

The charge recycle period, the precharge period, and the drive period are also provided in the subsequent horizontal scan period, and the above-described operation is performed in each period. The operation in the charge recycle period shown in FIG. 13 is the control in the first operation mode.

2.1.2 Second Control Method

Figure 14:
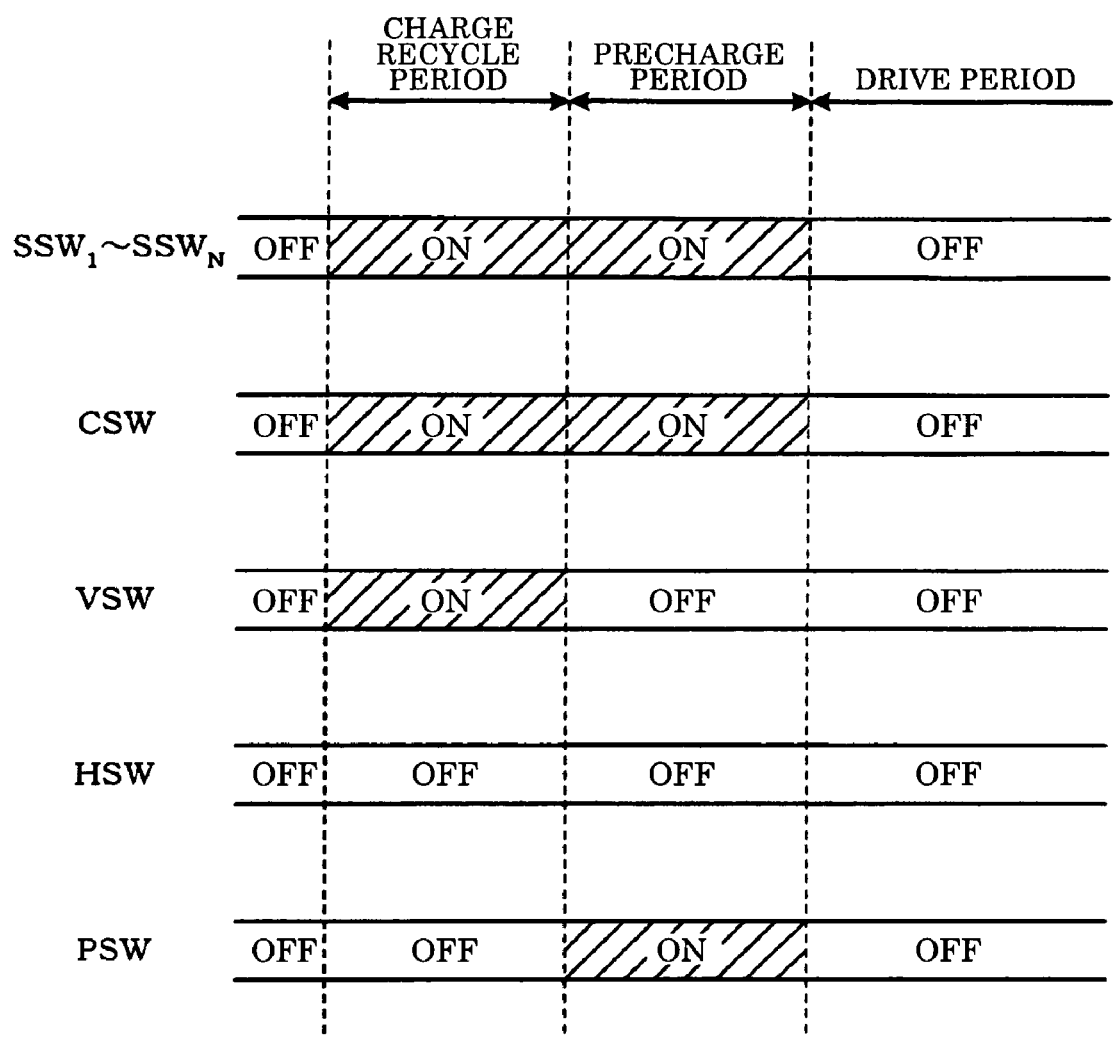
FIG. 14 is a view showing an example of a control timing of a second control method shown in FIG. 11.

FIG. 14 shows an example of the control timing of the second control method shown in FIG. 11.

FIG. 14 shows the case where each of the source output switch circuits $SSW_1$ to $SSW_N$ includes the source short-circuit switch, and illustrates the control state of the source short-circuit switch included in each source output switch circuit as the control state of each source output switch circuit. In FIG. 14, "ON" indicates that each switch is set in a conducting state, and "OFF" indicates that each switch is set in a non-conducting state.

In the second control method, a charge recycle period and a precharge period are provided before a drive period in which the source output operational amplifier drives the source line based on the grayscale voltage corresponding to the grayscale data.

In the charge recycle period, the source output switch circuits $SSW_1$ to $SSW_N$ are turned ON (i.e., the source short-circuit switch of each of the source output switch circuits $SSW_1$ to $SSW_N$ is turned ON), the source charge storage switch CSW is turned ON, the common electrode charge storage switch VSW is turned ON, the node short-circuit switch HSW is turned OFF, and the voltage setting switch PSW is turned OFF. In FIG. 9, the source short-circuit switches of the source output switch circuits $SSW_j$ and $SSW_k$ and the source charge storage switch CSW are turned ON, the common electrode charge storage switch VSW is turned ON, and the node short-circuit switch HSW is turned OFF in a state in which the output of the source voltage setting circuit 70 is set in a high impedance state.

As a result, the source lines $S_1$ to $S_N$ and the common line COL are short-circuited and the common line COL is electrically connected with one end of the second capacitor element CCS in the charge recycle period. The common electrode voltage output node VND is electrically connected with one end of the first capacitor element CCV. Therefore, a charge moves so that the source lines $S_1$ to $S_N$ and one end of the second capacitor element CCS are set at the same potential, whereby a charge is recycled. A charge also moves so that the common electrode voltage output node VND and one end of the first capacitor element CCV are set at the same potential, whereby a charge is recycled.

In the precharge period, control similar to that of the precharge period shown in FIG. 12 is performed. Specifically, the source output switch circuits $SSW_1$ to $SSW_N$ are turned ON (i.e., the source short-circuit switch of each of the source output switch circuits $SSW_1$ to $SSW_N$ is turned ON), the source charge storage switch CSW is turned ON, the common electrode charge storage switch VSW is turned OFF, the node short-circuit switch HSW is turned OFF, and the voltage setting switch PSW is turned ON. In FIG. 9, the source short-circuit switches of the source output switch circuits $SSW_j$ and $SSW_k$ are turned OFF, the node short-circuit switch HSW is turned OFF, the source charge storage switch CSW is turned ON, and the common electrode charge storage switch VSW is turned OFF. The source voltage setting circuit 70 supplies a precharge voltage PV to the source charge storage node C2ND.

As a result, the precharge voltage is applied to the source lines $S_1$ to $S_N$ through the common line COL.

In the drive period after the precharge period, the source output switch circuits $SSW_1$ to $SSW_N$ are turned OFF (i.e., the source short-circuit switch of each of the source output switch circuits $SSW_1$ to $SSW_N$ is turned OFF), the source charge storage switch CSW is turned OFF, the common electrode charge storage switch VSW is turned OFF, the node short-circuit switch HSW is turned OFF, and the voltage setting switch PSW is turned OFF. The operational amplifier circuit blocks $OPC_1$ to $OPC_N$ supply the grayscale voltage corresponding to the grayscale data to the source lines $S_1$ to $S_N$.

Figure 15:
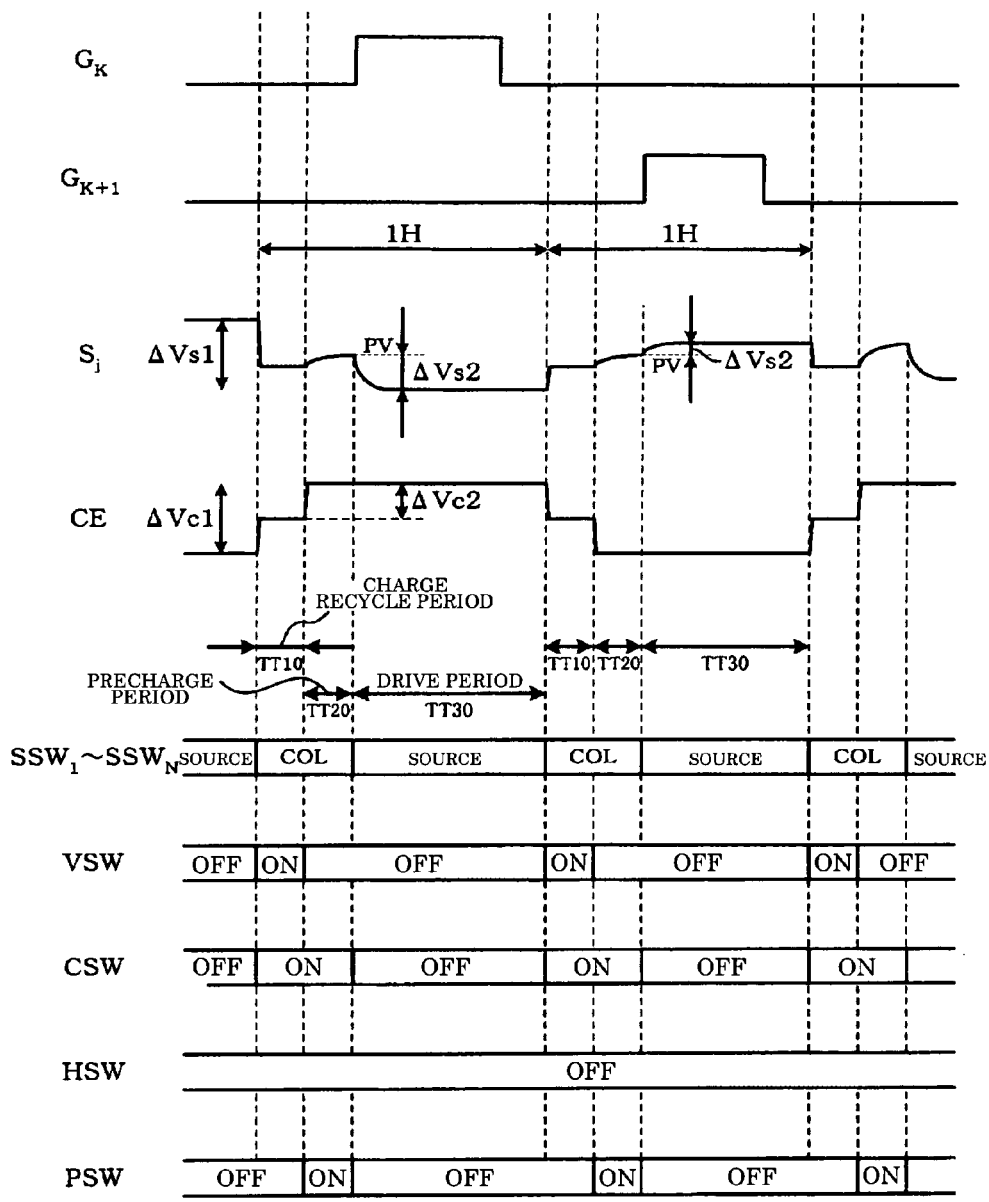
FIG. 15 is a waveform diagram showing an operation example of a liquid crystal device controlled using a second control method.

FIG. 15 is a waveform diagram showing an operation example of the liquid crystal device 10 controlled using the second control method.

FIG. 15 shows the changes in potentials of the gate lines $G_K$ and $G_{K+1}$, the source line $S_j$, and the common electrode CE. Note that the same waveforms apply to other gate lines and source lines. In FIG. 15, the scan voltage is applied to the gate line $G_K$ within one horizontal scan period (1H) which is the select period of the pixels connected with the gate line $G_K$, and the scan voltage is applied to the gate line $G_{K+1}$ within one horizontal scan period which is the select period of the pixels connected with the gate line $G_{K+1}$. Each horizontal scan period includes the charge recycle period, the precharge period, and the drive period.

In the charge recycle period (TT10), the source lines $S_j$ and $S_k$ are electrically connected with the common line COL including the second capacitor element connection node through the source output switch circuits $SSW_j$ and $SSW_k$, respectively. The source charge storage switch CSW is set in a conducting state, whereby the common line COL is electrically connected with one end of the second capacitor element CCS through the second capacitor element connection terminal TL2. The voltage setting switch PSW is set in a non-conducting state. Therefore, one end of the second capacitor element CCS and the source lines $S_j$ and $S_k$ are set at the same potential in the charge recycle period, whereby a charge stored in parasitic capacitors of the source lines is supplied to one end of the second capacitor element CCS, or a charge stored in the second capacitor element CCS is charged into parasitic capacitors of the source lines $S_j$ and $S_k$ according to the charge conservation law. Specifically, the potentials of the source lines are changed in the charge recycle period without supplying a charge from the power supply circuit 50.

In the charge recycle period, since the output of the common electrode voltage generation circuit (not shown) is set in a high impedance state and the common electrode charge storage switch VSW is set in a conducting state, the common electrode CE is electrically connected with one end of the first capacitor element CCV through the first capacitor element connection terminal TL1. Therefore, one end of the first capacitor element CCV and the common electrode CE are set at the same potential in the charge recycle period, whereby a charge stored in a parasitic capacitor of the common electrode CE is supplied to one end of the first capacitor element CCV, or a charge stored in the first capacitor element CCV is charged into a parasitic capacitor of the common electrode CE. Specifically, the potential of the common electrode CE is changed in the charge recycle period without supplying a charge from the power supply circuit 50.

In the precharge period (TT20) after the charge recycle period, the source lines $S_j$ and $S_k$ are electrically connected with the common line COL including the second capacitor element connection node through the source output switch circuits $SSW_j$ and $SSW_k$, respectively, in the same manner as in the charge recycle period. The source charge storage switch CSW and the voltage setting switch PSW are set in a conducting state, and the node short-circuit switch HSW is set in a non-conducting state. Therefore, the high-potential-side voltage VCOMH is supplied to the common electrode CE in the precharge period, for example. The precharge voltage PV is supplied to the common line COL. Since the common line COL is also electrically connected with the source lines $S_j$ and $S_k$ in the precharge period, the precharge voltage PV is supplied to the source lines $S_j$ and $S_k$.

In this case, the source voltage setting circuit 70 charges or discharges each source line until each source line is set at the potential of the precharge voltage PV with respect to the potential changed in the charge recycle period TT10. Accordingly, the source voltage setting circuit 70 generally need not change the voltage of the source line to a large extent in the precharge period after the charge recycle period. Specifically, when setting the potential of the source line in the present horizontal scan period (select period of the pixels connected with the gate line $G_K$) based on the potential of the source line in the preceding horizontal scan period (select period of the pixels connected with the gate line $G_{K-1}$), the source voltage setting circuit 70 must charge or discharge the source line by $\Delta Vs1$, as shown in FIG. 15. On the other hand, it suffices that the source voltage setting circuit 70 charge or discharge the source line by $\Delta Vs2$ ($\Delta Vs2 < \Delta Vs1$) by providing the charge recycle period, as shown in FIG. 15. For example, although the amount of charging/discharging of the source line may be increased by precharging the source line to the precharge voltage PV, the amount of charging/discharging of the source line may be significantly reduced in the next horizontal scan period (1H), as shown in FIG. 15.

Moreover, even if charging/discharging cannot be sufficiently performed within the charge recycle period, the pixel electrode write time which should be completed within one horizontal scan period (1H) can be reduced by providing the precharge period.

In the drive period (TT30) after the precharge period, the source lines $S_j$ and $S_k$ are electrically connected with the outputs of the output buffers of the source line driver circuit 20 through the source output switch circuits SSW$_L$ and SSW$_{L+1}$, respectively. The source charge storage switch CSW and the voltage setting switch PSW are set in a non-conducting state. Therefore, the source lines $S_j$ and $S_k$ are driven by the output buffers of the source line driver circuit 20 in the drive period.

In the drive period (TT30) after the precharge period, the common electrode charge storage switch VSW is set in a non-conducting state, whereby the common electrode CE is electrically connected with the output of the common electrode voltage generation circuit 56 of the power supply circuit 50. Therefore, the common electrode voltage VCOM from the common electrode voltage generation circuit 56 is supplied to the common electrode CE in the drive period. In this case, the common electrode voltage generation circuit 56 charges or discharges the common electrode CE until the high-potential-side voltage VCOMH is reached with respect to the potential changed in the charge recycle period TT10. Accordingly, the common electrode voltage generation circuit 56 need not change the voltage of the common electrode CE to a large extent in the drive period after the charge recycle period. Specifically, when setting the potential of the common electrode CE in the present horizontal scan period (select period of the pixels connected with the gate line $G_K$) based on the potential of the common electrode CE in the preceding horizontal scan period (select period of the pixels connected with the gate line $G_{K-1}$), the common electrode voltage generation circuit 56 must charge or discharge the common electrode CE by $\Delta Vc1$, as shown in FIG. 15. On the other hand, it suffices that the common electrode voltage generation circuit 56 charge or discharge the common electrode CE by $\Delta Vc2$ ($\Delta Vc2 < \Delta Vc1$) by providing the charge recycle period, as shown in FIG. 15.

The charge recycle period, the precharge period, and the drive period are also provided in the subsequent horizontal scan period, and the above-described operation is performed in each period. The operation in the charge recycle period shown in FIG. 15 is the control in the second operation mode.

Since power consumption accompanying driving the source lines in the charge recycle period varies depending on the voltage (i.e., grayscale data) set by the source line driver circuit 20 in the drive period, the effect of reducing power consumption by charge recycling is reduced. On the other hand, since the common electrode CE is set at the high-potential-side voltage VCOMH or the low-potential-side voltage VCOML, power consumption can be reliably reduced using a simple configuration independent of the display data, whereby the effect of reducing power consumption by charge recycling is remarkably increased.

In the first operation mode, since a charge can be recycled without using the first and second capacitor elements CCS and CCV, the chip size and the mounting area of the display driver 60 can be reduced. On the other hand, since the voltage corresponding to the display data is applied to the source line, the charge recycling effect varies depending on the display data.

In the second operation mode, since a binary common electrode voltage is used, the charge recycling effect of the common electrode CE is achieved, whereby the effect of reducing power consumption can be reliably obtained. On the other hand, since a charge is recycled without using the first or second capacitor element CCS or CCV, the chip size and the mounting area of the display driver 60 cannot be reduced.

According to this embodiment, since a charge can be recycled in the above operation mode merely by providing the node short-circuit switch HSW, it is possible to satisfy various users' demands using one type of display driver, whereby the manufacturing cost can be further reduced.

Moreover, power consumption accompanying source line precharging and the pixel electrode write time can be reduced by charge recycling by providing the source voltage setting circuit 70.

2.1.3 Third Control Method

Figure 16:
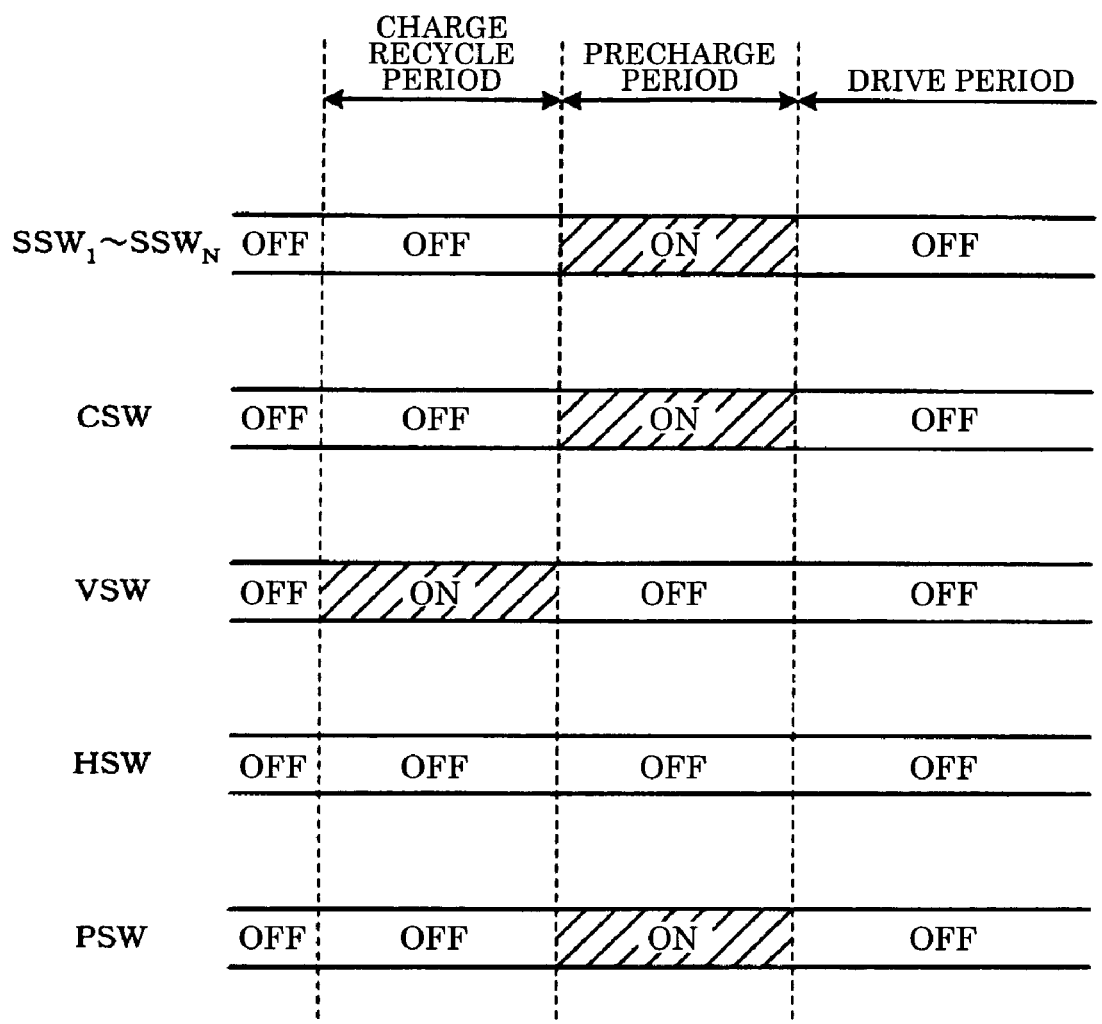
FIG. 16 is a view showing an example of a control timing of a third control method shown in FIG. 11.

FIG. 16 shows an example of the control timing of the third control method shown in FIG. 11.

FIG. 16 shows the case where each of the source output switch circuits SSW$_1$ to SSW$_N$ includes the source short-circuit switch, and illustrates the control state of the source short-circuit switch included in each source output switch circuit as the control state of each source output switch circuit. In FIG. 16, "ON" indicates that each switch is set in a conducting state, and "OFF" indicates that each switch is set in a non-conducting state.

In the third control method, a charge recycle period and a precharge period are provided before a drive period in which the source output operational amplifier drives the source line based on the grayscale voltage corresponding to the grayscale data.

In the charge recycle period, the source output switch circuits SSW$_1$ to SSW$_N$ are turned OFF (i.e., the source short-circuit switch of each of the source output switch circuits SSW$_1$ to SSW$_N$ is turned OFF), the source charge storage switch CSW is turned OFF, the common electrode charge storage switch VSW is turned ON, the node short-circuit switch HSW is turned OFF, and the voltage setting switch PSW is turned OFF. In FIG. 9, the source short-circuit switches of the source output switch circuits SSW$_j$ and SSW$_k$ are turned OFF, the source charge storage switch CSW is turned OFF, the common electrode charge storage switch VSW is turned ON, and the node short-circuit switch HSW is turned OFF.

As a result, since the source lines $S_1$ to $S_N$ and the common line COL are not short-circuited in the charge recycle period, a charge of the source lines $S_1$ to $S_N$ is not recycled. On the other hand, the common electrode voltage output node VND is electrically connected with one end of the first capacitor element CCV. Therefore, a charge also moves so that the common electrode voltage output node VND and one end of the first capacitor element CCV are set at the same potential, whereby a charge is recycled.

In the precharge period, control similar to that of the precharge period shown in FIG. 12 or 14 is performed. Specifically, the source output switch circuits $SSW_1$ to $SSW_N$ are turned ON (i.e., the source short-circuit switch of each of the source output switch circuits $SSW_1$ to $SSW_N$ is turned ON), the source charge storage switch CSW is turned ON, the common electrode charge storage switch VSW is turned OFF, the node short-circuit switch HSW is turned OFF, and the voltage setting switch PSW is turned ON. In FIG. 9, the source short-circuit switches of the source output switch circuits $SSW_j$ and $SSW_k$ are turned ON, the node short-circuit switch HSW is turned OFF, the source charge storage switch CSW is turned ON, and the common electrode charge storage switch VSW is turned OFF. The source voltage setting circuit 70 supplies a precharge voltage PV to the source charge storage node C2ND.

As a result, the precharge voltage is applied to the source lines $S_1$ to $S_N$ through the common line COL.

In the drive period after the precharge period, the source output switch circuits $SSW_1$ to $SSW_N$ are turned OFF (i.e., the source short-circuit switch of each of the source output switch circuits $SSW_1$ to $SSW_N$ is turned OFF), the source charge storage switch CSW is turned OFF, the common electrode charge storage switch VSW is turned OFF, the node short-circuit switch HSW is turned OFF, and the voltage setting switch PSW is turned OFF. The operational amplifier circuit blocks $OPC_1$ to $OPC_N$ supply the grayscale voltage corresponding to the grayscale data to the source lines $S_1$ to $S_N$.

2.1.4 Fourth Control Method

Figure 17:
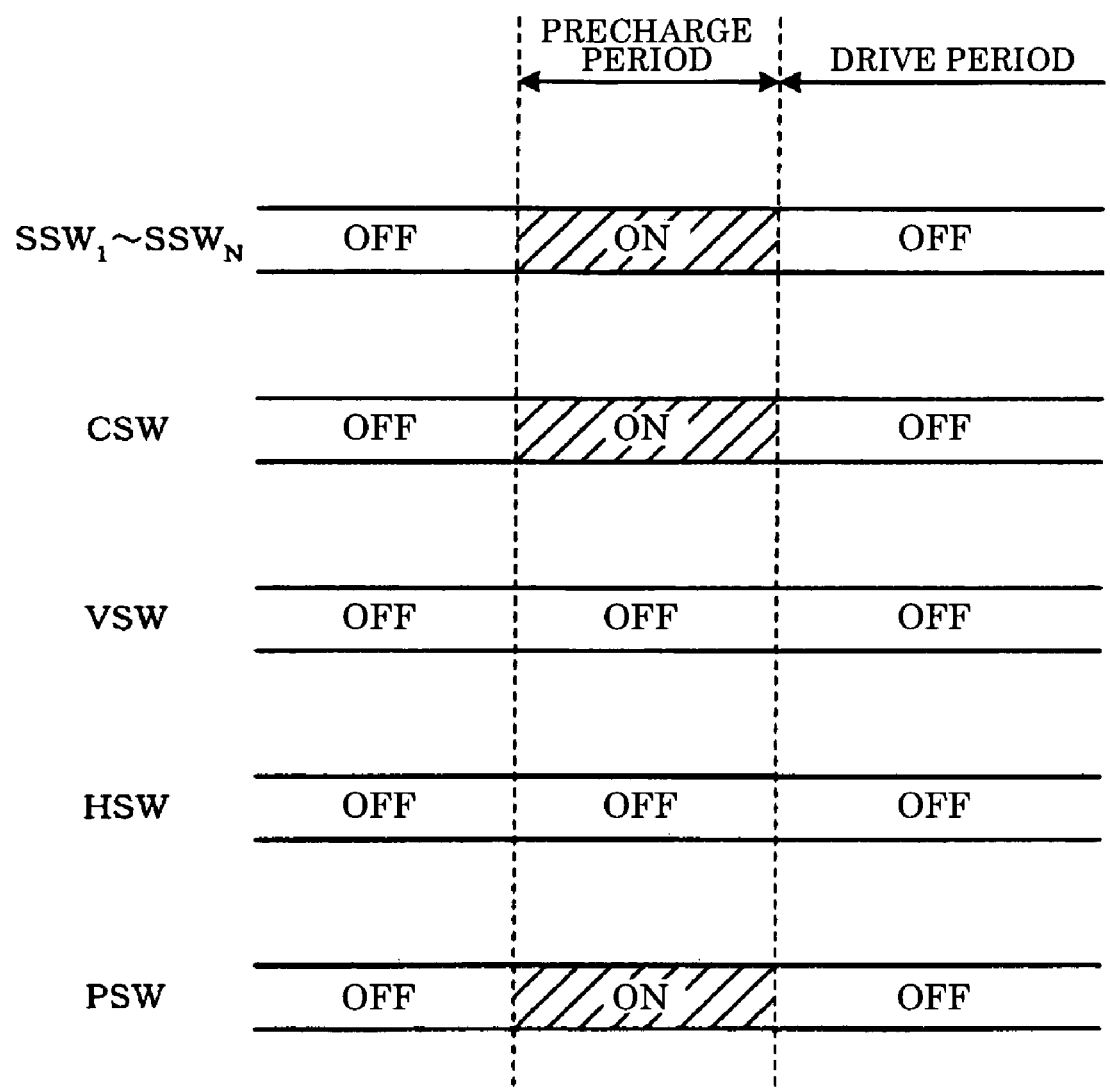
FIG. 17 is a view showing an example of a control timing of a fourth control method shown in FIG. 11.

FIG. 17 shows an example of the control timing of the fourth control method shown in FIG. 11.

FIG. 17 shows the case where each of the source output switch circuits $SSW_1$ to $SSW_N$ includes the source short-circuit switch, and illustrates the control state of the source short-circuit switch included in each source output switch circuit as the control state of each source output switch circuit. In FIG. 17, "ON" indicates that each switch is set in a conducting state, and "OFF" indicates that each switch is set in a non-conducting state.

In the fourth control method, a precharge period is provided before a drive period in which the source output operational amplifier drives the source line based on the grayscale voltage corresponding to the grayscale data.

In the precharge period, control similar to that of the precharge period shown in FIG. 12, 14, or 16 is performed. Specifically, the source output switch circuits $SSW_1$ to $SSW_N$ are turned ON (i.e., the source short-circuit switch of each of the source output switch circuits $SSW_1$ to $SSW_N$ is turned ON), the source charge storage switch CSW is turned ON, the common electrode charge storage switch VSW is turned OFF, the node short-circuit switch HSW is turned OFF, and the voltage setting switch PSW is turned ON. In FIG. 9, the source short-circuit switches of the source output switch circuits $SSW_j$ and $SSW_k$ are turned ON, the node short-circuit switch HSW is turned OFF, the source charge storage switch CSW is turned ON, and the common electrode charge storage switch VSW is turned OFF. The source voltage setting circuit 70 supplies a precharge voltage PV to the source charge storage node C2ND.

As a result, the precharge voltage is applied to the source lines $S_1$ to $S_N$ through the common line COL.

In the drive period after the precharge period, the source output switch circuits $SSW_1$ to $SSW_N$ are turned OFF (i.e., the source short-circuit switch of each of the source output switch circuits $SSW_1$ to $SSW_N$ is turned OFF), the source charge storage switch CSW is turned OFF, the common electrode charge storage switch VSW is turned OFF, the node short-circuit switch HSW is turned OFF, and the voltage setting switch PSW is turned OFF. The operational amplifier circuit blocks $OPC_1$ to $OPC_N$ supply the grayscale voltage corresponding to the grayscale data to the source lines $S_1$ to $S_N$.

The third and fourth control methods are control methods in which the second control method is partially omitted. Accordingly, it should be understood that a person skilled in the art can implement the third and fourth control methods referring to FIG. 13 or 15 based on the detailed description of the first or second control method given above with reference to FIG. 13 or 15.

As described above, the display driver 60 according to this embodiment having the configuration shown in FIG. 9 can give priority to a reduction in power consumption or a reduction in cost using a simple configuration when recycling a charge. Moreover, the display driver 60 can write the desired grayscale voltage into the source line or the pixel electrode electrically connected with the source line at high speed utilizing the precharge function, even when recycling a charge.

2.2 Modification

In this embodiment, the operational amplifier OPS of the source voltage setting circuit 70 may perform a class B amplification operation. An operational amplifier OPS which performs a class B amplification operation independently performs control of shifting the output voltage VOUT to the high potential side and control of shifting the output voltage VOUT to the low potential side.

Figure 18:
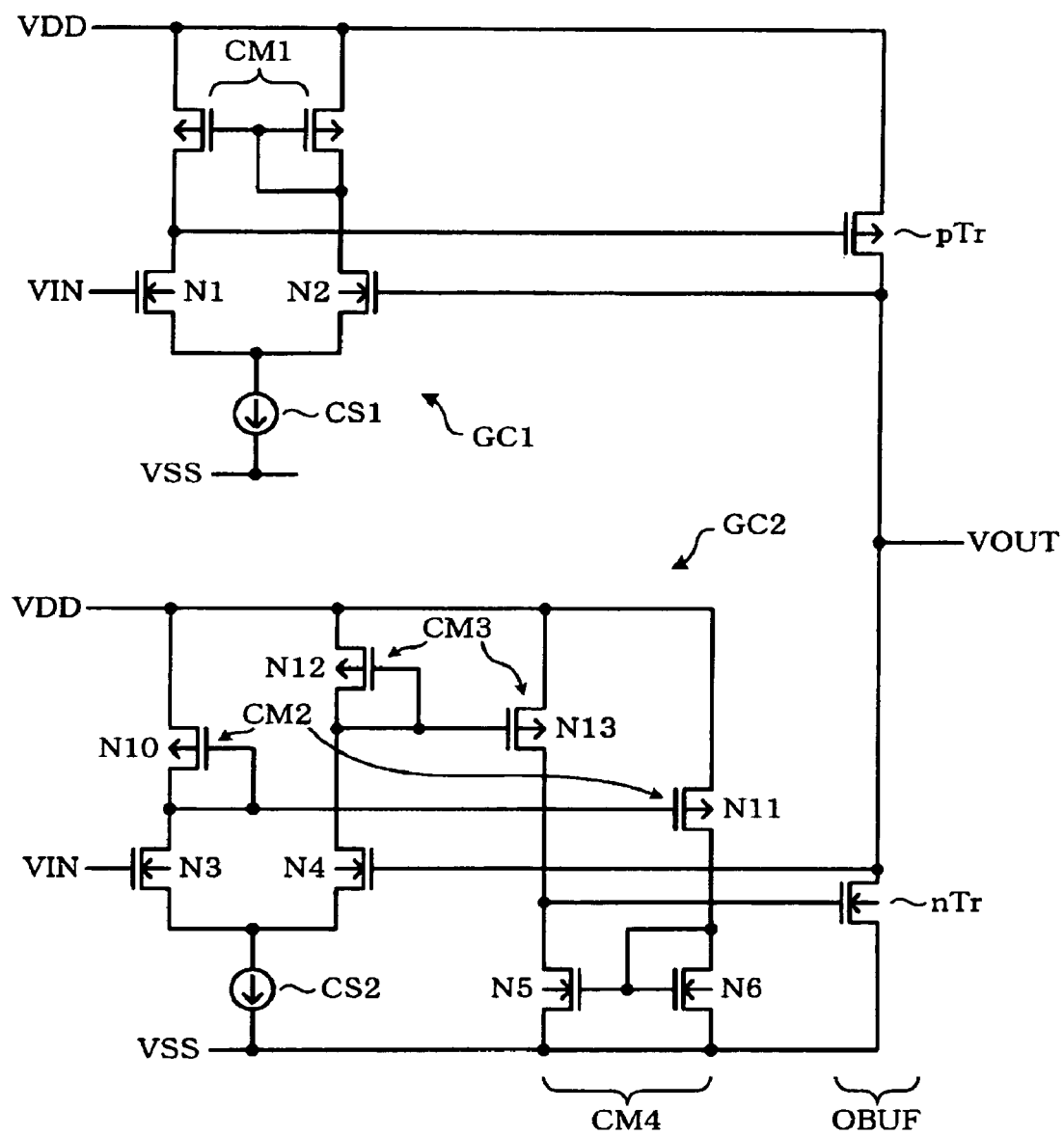
FIG. 18 is a circuit diagram showing an operational amplifier of a source voltage setting circuit according to a first modification.

FIG. 18 is a circuit diagram showing a configuration example of the operational amplifier OPS of the source voltage setting circuit 70 according to a first modification of this embodiment.

The operational amplifier OPS of the source voltage setting circuit 70 according to the first modification includes an output circuit OBUF. The output circuit OBUF includes a P-type (first conductivity type in a broad sense) metal-oxide-semiconductor (MOS) transistor (MOS transistor is hereinafter simply referred to as "transistor") pTr and an N-type (second conductivity type in a broad sense) transistor nTr. The system power supply voltage VDD is supplied to the source of the p-type driver transistor pTr, and the system ground power supply voltage VSS is supplied to the source of the n-type driver transistor nTr. The drain of the p-type driver transistor pTr is connected with the drain of the n-type driver transistor nTr, and the drain voltage is output as the output voltage VOUT.

The gate of the p-type driver transistor pTr is controlled by a first gate control circuit GC1. The gate of the n-type driver transistor nTr is controlled by a second gate control circuit GC2. A difference is provided between a voltage VH which shifts the output voltage VOUT to the high potential side and a voltage VL which shifts the output voltage VOUT to the low potential side using the first and second gate control circuits GC1 and GC2, whereby a shoot-through current flowing through the output circuit OBUF is prevented when the output voltage VOUT is between the voltage VH and the voltage VL so that unnecessary current consumption can be reduced.

The first gate control circuit GC1 includes an n-type differential amplifier circuit. The first gate control circuit GC1 includes n-type transistors N1 and N2 forming a differential pair, and a current-mirror circuit CM1. A constant current source CS1 is connected with the sources of the transistors N1 and N2. The current-mirror circuit CM1 is connected with the drains of the transistors N1 and N2. The drain of the transistor N1 is connected with the gate of the p-type driver transistor pTr, and the p-type driver transistor pTr is gate-controlled based on the voltage of the drain of the transistor N1.

The current drive capability of the transistor N1 is lower than the current drive capability of the transistor N2. An input voltage VIN is supplied to the gate of the transistor N1, and the output voltage VOUT is supplied to the gate of the transistor N2. Therefore, an equilibrium state occurs when the input voltage VIN is set at a voltage VU of which the potential is higher than that of the output voltage VOUT. If the input voltage VIN is a fixed voltage, when the potential of the output voltage VOUT is higher than the potential which achieves an equilibrium state, the potential of the gate of the p-type driver transistor pTr decreases to increase the potential of the output voltage VOUT. When the potential of the output voltage VOUT becomes lower than the potential which achieves an equilibrium state, the output voltage VOUT is not controlled using the p-type driver transistor pTr.

The second gate control circuit GC2 includes n-type transistors N3 and N4 forming a differential pair, and current-mirror circuits CM2, CM3, and CM4. A constant current source CS2 is connected with the sources of the transistors N3 and N4.

The current-mirror circuit CM2 includes p-type transistors N10 and N11. The current-mirror circuit CM2 includes p-type transistors N12 and N13. The current-mirror circuit CM3 includes n-type transistors N5 and N6.

The drain of the transistor N10 of the current-mirror circuit CM2 is connected with the drain of the transistor N3. The drain (and the gate) of the transistor N12 of the current-mirror circuit CM3 is connected with the transistor N4.

The drain of the transistor N6 of the current-mirror circuit CM4 is connected with the drain of the transistor N11 of the current-mirror circuit CM2. The drain of the transistor N5 of the current-mirror circuit CM4 is connected with the drain of the transistor N13 of the current-mirror circuit CM3. The drain of the transistor N5 is connected with the gate of the n-type driver transistor nTr, and the n-type driver transistor nTr is gate-controlled based on the voltage of the drain of the transistor N5.

The current drive capability of the transistor N3 is higher than the current drive capability of the transistor N4. The input voltage VIN is supplied to the gate of the transistor N3, and the output voltage VOUT is supplied to the gate of the transistor N4. Therefore, an equilibrium state occurs when the input voltage VIN is set at a voltage VD of which the potential is lower than that of the output voltage VOUT. If the input voltage VIN is a fixed voltage, when the potential of the output voltage VOUT is lower than the potential which achieves an equilibrium state, the drain current of the transistor N3 increases. As a result, the potential of the gate of the n-type driver transistor nTr increases to decrease the potential of the output voltage VOUT. When the potential of the output voltage VOUT becomes higher than the potential which achieves an equilibrium state, the output voltage VOUT is not controlled using the n-type driver transistor nTr.

As described above, when the potential of the output voltage VOUT is lower than the potential which achieves an equilibrium state by the voltage VU or the potential of the output voltage VOUT is higher than the potential which achieves an equilibrium state by the voltage VD, the p-type driver transistor pTr and the n-type driver transistor nTr forming the output circuit OBUF are turned OFF, whereby a shoot-through current flowing through the output circuit OBUF can be prevented. Specifically, unnecessary shoot-through current can be prevented when the output voltage of the operational amplifier OPS of the source voltage setting circuit 70 is within the above-mentioned range, and the output voltage VOUT can be supplied as the precharge voltage by causing a current to flow through the output circuit OBUF when the output voltage of the operational amplifier OPS of the source voltage setting circuit 70 is outside the above-mentioned range. Therefore, power consumption can be reduced using a simple configuration when performing precharging as described above.

Although this embodiment or the first modification illustrates an example in which the input voltage VIN is a fixed voltage, the invention is not limited thereto. In a second modification of this embodiment, the voltage output from the source voltage setting circuit 70 as the precharge voltage PV is changed depending on the polarity when performing polarity inversion drive. Since the intermediate value of the grayscale voltage supplied to the source line differs between the positive period and the negative period, the amount of charging/discharging after the precharge period can be reduced irrespective of the positive period and the negative period by changing the voltage output from the source voltage setting circuit 70 depending on the polarity.

Figure 19:
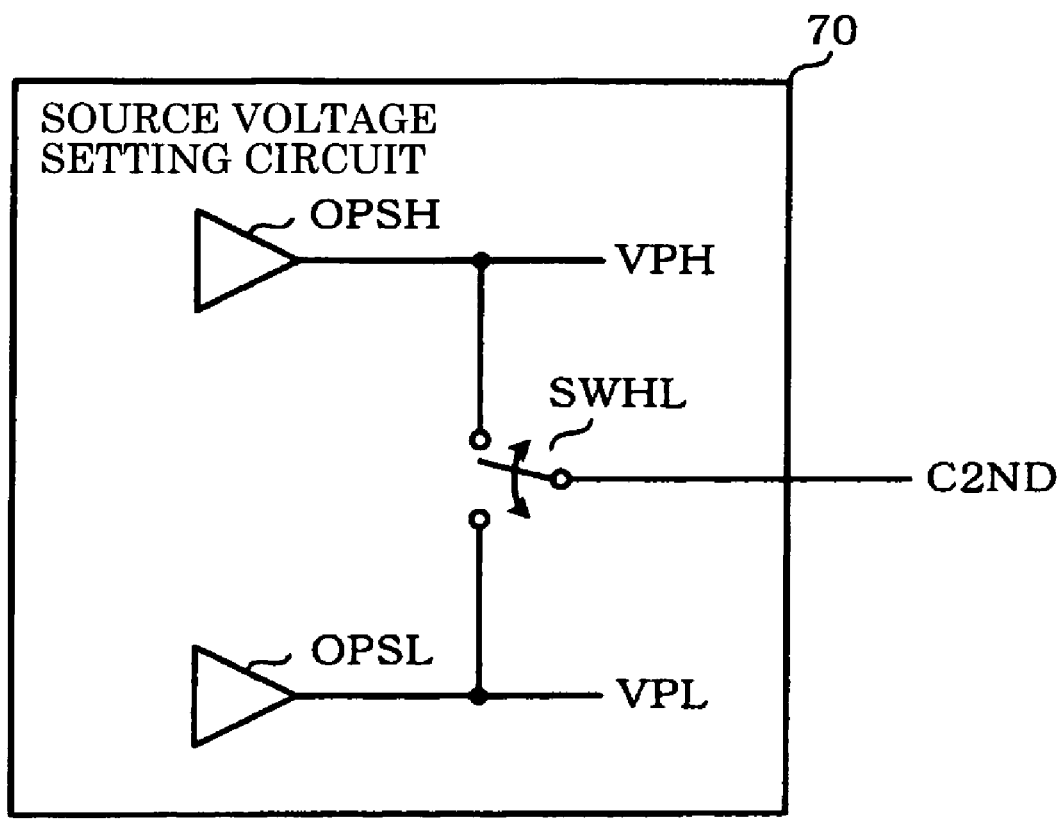
FIG. 19 is a block diagram showing a configuration example of a source voltage setting circuit according to a second modification.

FIG. 19 is a block diagram showing a configuration example of the source voltage setting circuit 70 according to the second modification of this embodiment.

The source voltage setting circuit 70 according to the second modification includes voltage-follower-connected operational amplifiers OPSH and OPSL and a switch circuit SWHL. The operational amplifier OPSH outputs the high-potential-side precharge voltage VH. The operational amplifier OPSL outputs the low-potential-side precharge voltage VL. Specifically, the potential of the precharge voltage VH is higher than the potential of the precharge voltage VL.

The switch circuit SWHL outputs the precharge voltage VH or the precharge voltage VL in the precharge period based on the polarity inversion signal which specifies the polarity inversion timing. The switch circuit SWHL sets the output of the source voltage setting circuit 70 in a high impedance state in a period other than the precharge period. The output of the switch circuit SWHL is electrically connected with the source charge storage node C2ND.

3. Electronic Instrument

Figure 20:
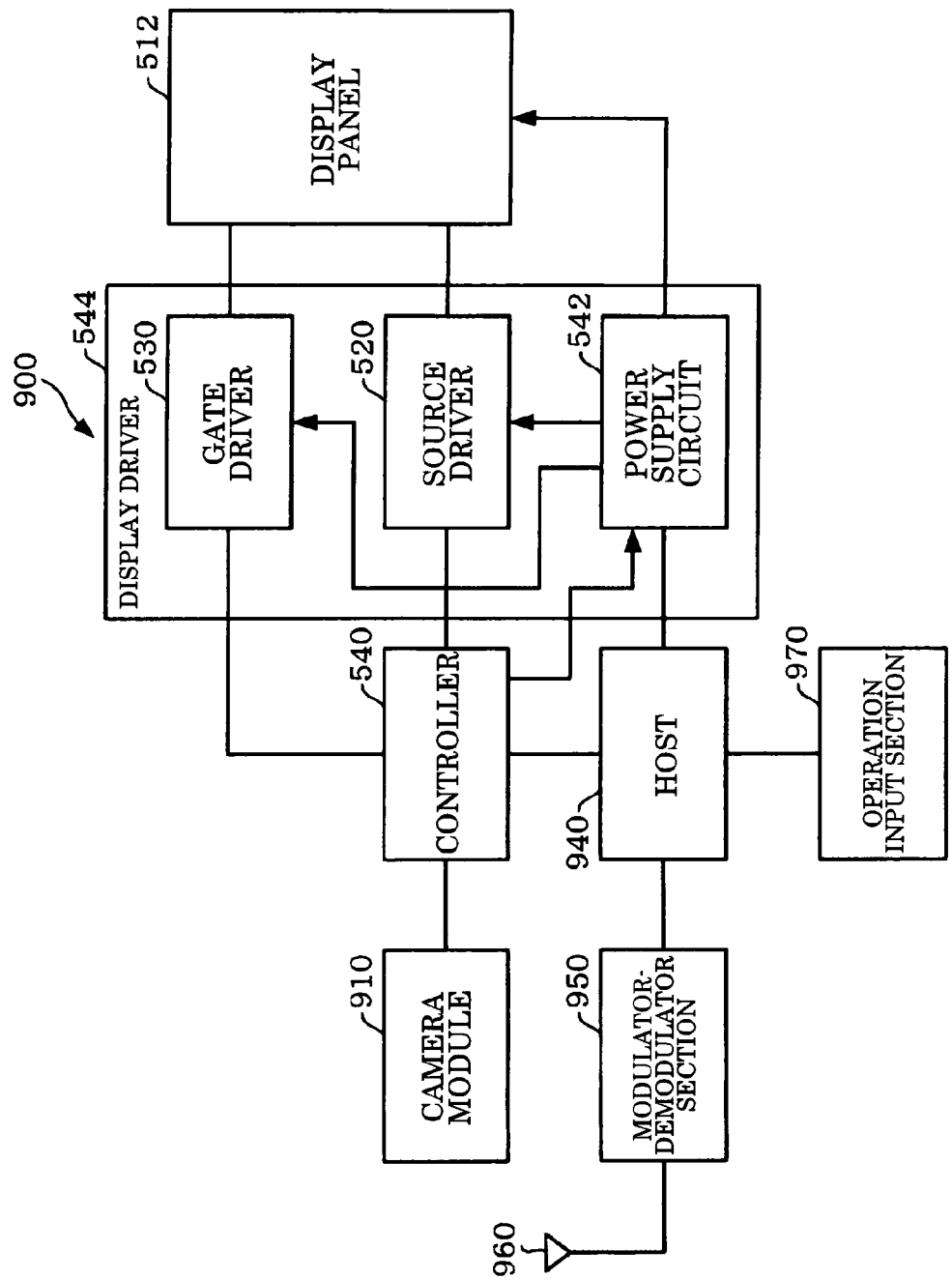
FIG. 20 is a block diagram showing a configuration example of an electronic instrument according to one embodiment of the invention.

FIG. 20 is a block diagram of a configuration example of an electronic instrument according to this embodiment. FIG. 20 is a block diagram showing a configuration example of a portable telephone as an example of the electronic instrument.

A portable telephone 900 includes a camera module 910. The camera module 910 includes a CCD camera, and supplies image data obtained by the CCD camera to a display controller 540 in a YUV format. The display controller 540 has the functions of the display controller 40 shown in FIG. 1 or 2.

The portable telephone 900 includes a display panel 512. The display panel 512 is driven by a source driver 520 and a gate driver 530. The display panel 512 includes gate lines, source lines, and pixels. The display panel 512 has the functions of the display panel 12 shown in FIG. 1 or 2.

The display controller 540 is connected with the source driver 520 and the gate driver 530, and supplies grayscale data in an RGB format to the source driver 520.

A power supply circuit 542 is connected with the source driver 520 and the gate driver 530, and supplies drive power supply voltages to the source driver 520 and the gate driver 530. The power supply circuit 542 has the function of the power supply circuit 50 shown in FIG. 1 or 2. The portable telephone 900 includes the source driver 520, the gate driver 530, and the power supply circuit 542 as a display driver 544. The display driver 544 drives the display panel 512.

A host 940 is connected with the display controller 540. The host 940 controls the display controller 540. The host 940 demodulates grayscale data received via an antenna 960 using a modulator-demodulator section 950, and supplies the demodulated grayscale data to the display controller 540. The display controller 540 causes the source driver 520 and the gate driver 530 to display an image on the display panel 512 based on the grayscale data. The source driver 520 has the function of the source line driver circuit 20 shown in FIG. 1 or 2. The gate driver 530 has the function of the gate line driver circuit 30 shown in FIG. 1 or 2.

The host 940 modulates grayscale data generated by the camera module 910 using the modulator-demodulator section 950, and directs transmission of the modulated data to another communication device via the antenna 960.

The host 940 transmits and receives grayscale data, captures an image using the camera module 910, and displays an image on the display panel 512 based on operation information from an operation input section 970.

Although only some embodiments of the invention have been described above in detail, those skilled in the art would readily appreciate that many modifications are possible in the embodiments without materially departing from the novel teachings and advantages of the invention. Accordingly, such modifications are intended to be included within the scope of the invention. For example, the invention may be applied not only to drive the above liquid crystal display panel, but also to drive an electroluminescent display device, a plasma display device, and the like.

This embodiment and the first or second modification have been described above taking an example in which all of the source lines are short-circuited with the common line COL. Note that the invention is not limited thereto. Only one source line may be short-circuited with the common line COL. However, it is preferable to short-circuit two or more source lines with the common line COL.

Some of the requirements of any claim of the invention may be omitted from a dependent claim which depends on that claim. Some of the requirements of any independent claim of the invention may be allowed to depend on any other independent claim.

What is claimed is:

1. A driver circuit for driving a plurality of source lines of an electro-optical device, the driver circuit comprising:
    a first source short-circuit circuit that short-circuits a first source line and a source short-circuit node;
    a second source short-circuit circuit that short-circuits a second source line and the source short-circuit node, the first source line and the second source line being among the plurality of source lines;
    a first source output operational amplifier and a second source output operational amplifier that respectively output a grayscale voltage corresponding to grayscale data to the first source line and the second source line;
    a source charge storage short-circuit circuit that short-circuits a source charge storage node and the source short-circuit node, the source charge storage node being connected with one end of a source capacitor;
    a voltage setting circuit that supplies a given voltage to the source charge storage node; and
    a node short-circuit circuit that short-circuits a common electrode voltage output node and the source short-circuit node, a voltage outputted to a common electrode of the electro-optical device provided opposite to a pixel electrode through an electro-optical element being applied to the common electrode voltage output node,
    the voltage setting circuit including an operational amplifier to which a given precharge voltage is input, an output voltage of the operational amplifier being supplied to the one end of the source capacitor, and
    a high-potential-side power supply voltage of the first source output operational amplifier and the second source output operation amplifier differing from a high-potential-side power supply voltage of the operational amplifier of the voltage setting circuit.

2. The driver circuit as defined in claim 1,
    in a charge recycle period,
    the first source short-circuit circuit and second source short-circuit circuit turning into a conducting state, the node short-circuit circuit turning into a conducting state, and the source charge storage short-circuit circuit turning into a non-conducting state,
    in a precharge period after the charge recycle period,
    the node short-circuit circuit turning into a non-conducting state, the first source short-circuit circuit and the second source short-circuit circuit turning into a conducting state, and the source charge storage short-circuit circuit turning into a conducting state, and the voltage setting circuit precharging the first source line and the second source line,
    in a driving period after the precharge period,
    the first source short-circuit circuit and the second source short-circuit circuit turning into a non-conducting state, and each of the first source output operational amplifier and the second source output operational amplifier outputting the grayscale voltage to each of the plurality of source lines.

3. The driver circuit as defined in claim 1,
    in a charge recycle period
    the first source short-circuit circuit and the second source short-circuit circuit turning into a conducting state, the source charge storage short-circuit circuit turning into a conducting state, and the node short-circuit circuit turning into a non-conducting state while an output of the voltage setting circuit being set in a high impedance state,
    in a precharge period after the charge recycle period,
    the voltage setting circuit precharging the first source line and the second source line,
    in a driving period after the precharge period
    the first source short-circuit circuit and the second source short-circuit circuit turning into a non-conducting state, and each of the first source output operational amplifier and the second source output operational amplifier outputting the grayscale voltage to each of the plurality of source lines.

4. The driver circuit as defined in claim 1, the driver circuit including the source capacitor.

5. The driver circuit as defined in claim 1,
    the voltage setting circuit applying an OFF voltage of the electro-optical device to the source charge storage node when the voltage setting circuit precharges the first source line and the second source line.

6. The driver circuit as defined in claim 1,
    the voltage setting circuit applying a voltage that differs depending on a polarity a polarity of a voltage applied to the electro-optical element to the source charge storage node when polarity inversion drive of the common electrode is performed.

7. The driver circuit as defined in claim 1,
    the high-potential-side power supply voltage of the first source output operational amplifier and the second source output operational amplifier being a voltage obtained by boosting the high-potential-side power supply voltage of the operational amplifier of the voltage setting circuit.

8. An electro-optical device comprising:
    a plurality of source lines;
    a plurality of gate lines;

a plurality of pixels connected with one of the plurality of source lines and one of the plurality of gate lines;

a gate driver that scans the plurality of gate lines; and the driver circuit as defined in claim 1 that drives the plurality of source lines.

9. An electronic instrument comprising the electro-optical device as defined in claim 8.

10. An electronic instrument comprising the driver circuit as defined in claim 1.

11. A driver circuit for driving a plurality of source lines of an electro-optical device, the driver circuit comprising:

a first source short-circuit circuit that short-circuits a first source line and a source short-circuit node;

a second source short-circuit circuit that short-circuits a second source line and the source short-circuit node, the first source line and the second source line being among the plurality of source lines;

a source charge storage short-circuit circuit that short-circuits a source charge storage node and the source short-circuit node, the source charge storage node being connected with one end of a source capacitor;

a voltage setting circuit that supplies a given voltage to the source charge storage node;

a node short-circuit circuit that short-circuits a common electrode voltage output node and the source short-circuit node, a voltage outputted to a common electrode of the electro-optical device provided opposite to a pixel electrode through an electro-optical element being applied to the common electrode voltage output node; and a common electrode charge storage short-circuit circuit that short-circuits a common electrode charge storage node and the common electrode voltage output node, the common electrode charge storage node being connected with one end of a common electrode capacitor, the common electrode capacitor being charged or discharged by repeatedly setting the common electrode charge storage short-circuit circuit in a conducting state and a non-conducting state while setting the node short-circuit circuit in a non-conducting state.

12. The driver circuit as defined in claim 11, the voltage setting circuit including an operational amplifier to which a given precharge voltage is input, an output voltage of the operational amplifier being supplied to one end of the source capacitor.

13. The driver circuit as defined in claim 12, the operational amplifier performing a class B amplification operation.

14. The driver circuit as defined in claim 12, the driver circuit including:

a first source output operational amplifier and a second source output operational amplifier that respectively output a grayscale voltage corresponding to grayscale data to the first source line and the second source line, a high-potential-side power supply voltage of the first source output operational amplifier and the second source output operational amplifier differing from a high-potential-side power supply voltage of the operational amplifier of the voltage setting circuit.

15. An electro-optical device comprising:

a plurality of source lines;

a plurality of gate lines;

a plurality of pixels connected with one of the plurality of source lines and one of the plurality of gate lines;

a gate driver that scans the plurality of gate lines; and the driver circuit as defined in claim 7 that drives the plurality of source lines.

16. An electronic instrument comprising the electro-optical device as defined in claim 15.

17. An electronic instrument comprising the driver circuit as defined in claim 11.

* * * * *